(12) United States Patent
Clampitt et al.

(10) Patent No.: US 12,040,223 B2
(45) Date of Patent: Jul. 16, 2024

(54) MICROELECTRONIC DEVICES INCLUDING VOIDS NEIGHBORING CONDUCTIVE CONTACTS, AND RELATED MEMORY DEVICES, ELECTRONIC SYSTEMS, AND METHODS

(71) Applicant: Micron Technology, Inc., Boise, ID (US)

(72) Inventors: Darwin A. Clampitt, Wilder, ID (US); John D. Hopkins, Meridian, ID (US); Madison D. Drake, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 154 days.

(21) Appl. No.: 17/141,722

(22) Filed: Jan. 5, 2021

(65) Prior Publication Data

US 2022/0216094 A1 Jul. 7, 2022

(51) Int. Cl.
| | |
|---|---|
| *H01L 21/768* | (2006.01) |
| *H01L 23/532* | (2006.01) |
| *H01L 23/535* | (2006.01) |
| *H10B 41/27* | (2023.01) |
| *H10B 43/27* | (2023.01) |

(52) U.S. Cl.
CPC .... *H01L 21/7682* (2013.01); *H01L 21/76805* (2013.01); *H01L 21/76895* (2013.01); *H01L 23/53257* (2013.01); *H01L 23/5329* (2013.01); *H01L 23/535* (2013.01); *H10B 41/27* (2023.02); *H10B 43/27* (2023.02)

(58) Field of Classification Search
CPC ........... H01L 29/40117; H01L 23/5226; H01L 29/7926; H01L 21/76877; H01L 21/76816; H10B 43/27; H10B 41/27; H10B 43/10; H10B 43/35; H10B 43/40
See application file for complete search history.

(56) References Cited

U.S. PATENT DOCUMENTS

| | | |
|---|---|---|
| 8,546,239 B2 | 10/2013 | Harari et al. |
| 8,778,749 B2 | 7/2014 | Pachamuthu et al. |
| (Continued) | | |

OTHER PUBLICATIONS

International Search Report for Application No. PCT/US2021/062059, dated Mar. 23, 2022, 3 pages.

(Continued)

*Primary Examiner* — Tony Tran
(74) *Attorney, Agent, or Firm* — TraskBritt

(57) ABSTRACT

A microelectronic device comprises a stack structure comprising a vertically alternating sequence of conductive structures and insulative structures arranged in tiers, strings of memory cells vertically extending through the stack structure, the strings of memory cells individually comprising a channel material vertically extending through the stack structure, a conductive contact structure vertically overlying and in electrical communication with the channel material of a string of memory cells of the strings of memory cells, and a void laterally neighboring the conductive contact structure, the conductive contact structure separated from a laterally neighboring conductive contact structure by the void, a dielectric material, and an additional void laterally neighboring the laterally neighboring conductive contact structure. Related memory devices, electronic systems, and methods are also described.

14 Claims, 19 Drawing Sheets

(56) References Cited

U.S. PATENT DOCUMENTS

| | | |
|---|---|---|
| 9,123,714 B2 | 9/2015 | Pachamuthu et al. |
| 9,165,859 B2 | 10/2015 | Lim et al. |
| 9,401,371 B1 | 7/2016 | Lee et al. |
| 9,425,200 B2 | 8/2016 | Hwang et al. |
| 9,449,982 B2 | 9/2016 | Lu et al. |
| 9,698,097 B2 | 7/2017 | Lee et al. |
| 9,786,598 B2 | 10/2017 | Kim et al. |
| 9,899,399 B2 | 2/2018 | Ogawa et al. |
| 10,050,054 B2 | 8/2018 | Zhang et al. |
| 10,256,141 B2 | 4/2019 | Chandhok et al. |
| 10,403,632 B2 | 9/2019 | Ogawa et al. |
| 2013/0320550 A1 | 12/2013 | Kim |
| 2014/0138687 A1 | 5/2014 | Lee et al. |
| 2014/0159135 A1 | 6/2014 | Fujimoto et al. |
| 2014/0361360 A1 | 12/2014 | Alsmeier et al. |
| 2016/0071926 A1 | 3/2016 | Kitazaki et al. |
| 2016/0093635 A1* | 3/2016 | Rabkin ............... H10B 41/35 257/314 |
| 2016/0141337 A1 | 5/2016 | Shimabukuro et al. |
| 2016/0276273 A1 | 9/2016 | Kwon et al. |
| 2017/0040207 A1 | 2/2017 | Purayath et al. |
| 2017/0076974 A1 | 3/2017 | Choi et al. |
| 2019/0096907 A1 | 3/2019 | Lai et al. |
| 2019/0393238 A1 | 12/2019 | Lim et al. |

OTHER PUBLICATIONS

Written Opinion of the International Searching Authority for Application No. PCT/US2021/062059, dated Mar. 23, 2022, 4 pages.

\* cited by examiner

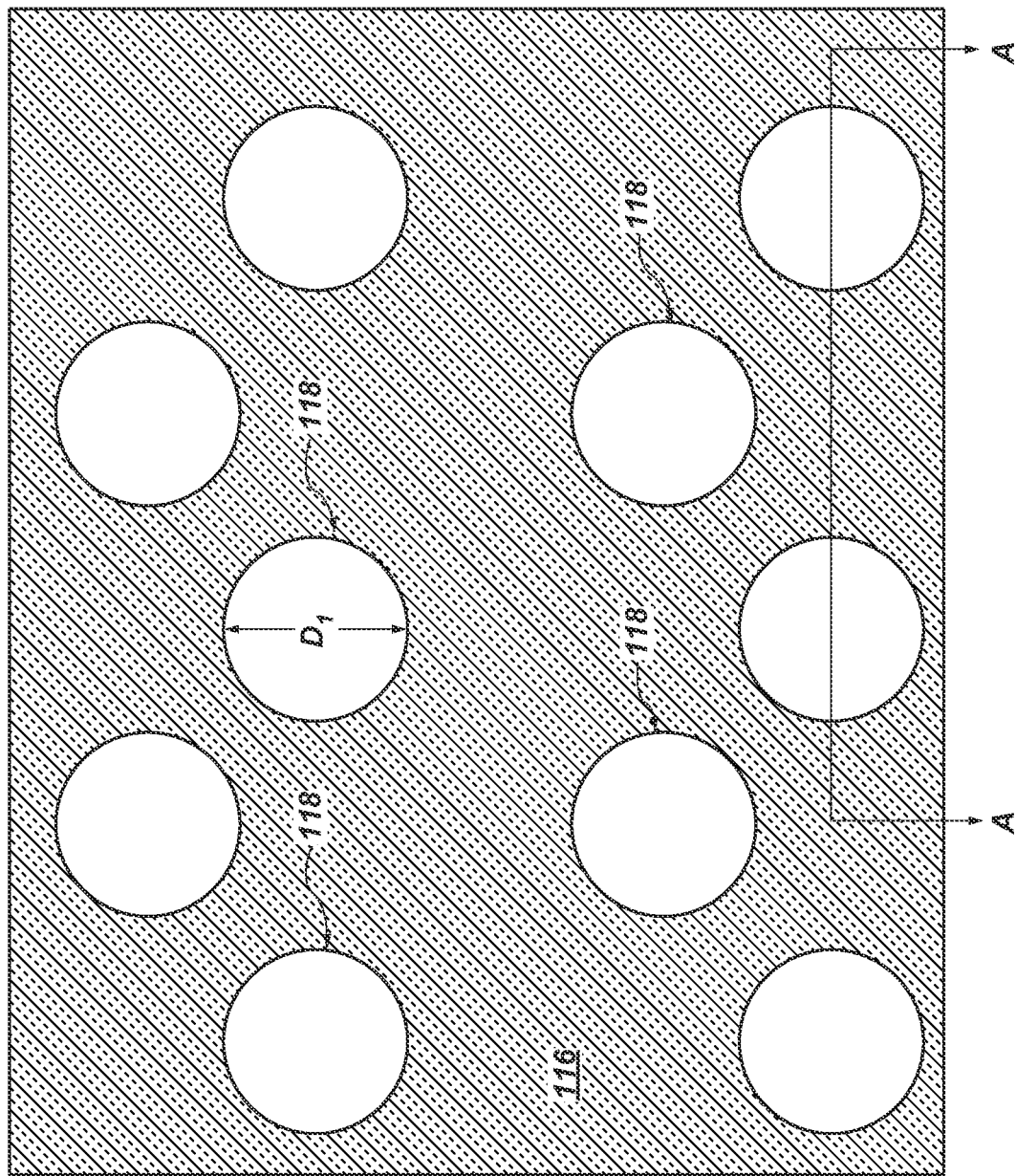

MICROELECTRONIC DEVICES INCLUDING VOIDS NEIGHBORING CONDUCTIVE CONTACTS, AND RELATED MEMORY DEVICES, ELECTRONIC SYSTEMS, AND METHODS

TECHNICAL FIELD

The disclosure, in various embodiments, relates generally to the field of microelectronic device design and fabrication. More specifically, the disclosure relates to microelectronic devices and apparatuses including voids laterally neighboring conductive contacts, and to related memory devices, electronic systems, and methods of forming the microelectronic devices.

BACKGROUND

A continuing goal of the microelectronics industry has been to increase the memory density (e.g., the number of memory cells per memory die) of memory devices, such as non-volatile memory devices (e.g., NAND Flash memory devices). One way of increasing memory density in non-volatile memory devices is to utilize vertical memory array (also referred to as a "three-dimensional (3D) memory array") architectures. A conventional vertical memory array includes vertical memory strings extending through openings in a stack of tiers of conductive structures (e.g., word lines) and dielectric materials at each junction of the vertical memory strings and the conductive structures. Such a configuration permits a greater number of switching devices (e.g., transistors) to be located in a unit of die area (i.e., length and width of active surface consumed) by building the array upwards (e.g., longitudinally, vertically) on a die, as compared to structures with conventional planar (e.g., two-dimensional) arrangements of transistors.

Conventional vertical memory arrays include electrical connections between the conductive structures and access lines (e.g., the word lines) so that memory cells in the vertical memory array can be uniquely selected for writing, reading, or erasing operations. One method of forming such an electrical connection includes forming so-called at least one "staircase" (or "stair step") structure at edges (e.g., horizontal ends) of the tiers of conductive structures. The staircase structure includes individual "steps" providing contact regions of the conductive structures upon which conductive contact structures can be positioned to provide electrical access to the conductive structures.

As vertical memory array technology has advanced, additional memory density has been provided by forming vertical memory arrays to include stacks comprising additional tiers of conductive structures and, hence, additional staircase structures and/or additional steps in individual staircase structures associated therewith. As the lateral spacing of vertical memory strings decreases, the lateral distance between laterally neighboring conductive structures coupled to the vertical memory strings decreases. However, as the dimensions and spacing of the conductive structures continue to decrease, parasitic (e.g., stray) capacitance between neighboring conductive structures increases. For example, the reduced distance between laterally neighboring conductive structures results an undesirable increase in capacitive coupling between the laterally neighboring conductive structures.

DETAILED DESCRIPTION

Figure 1A:
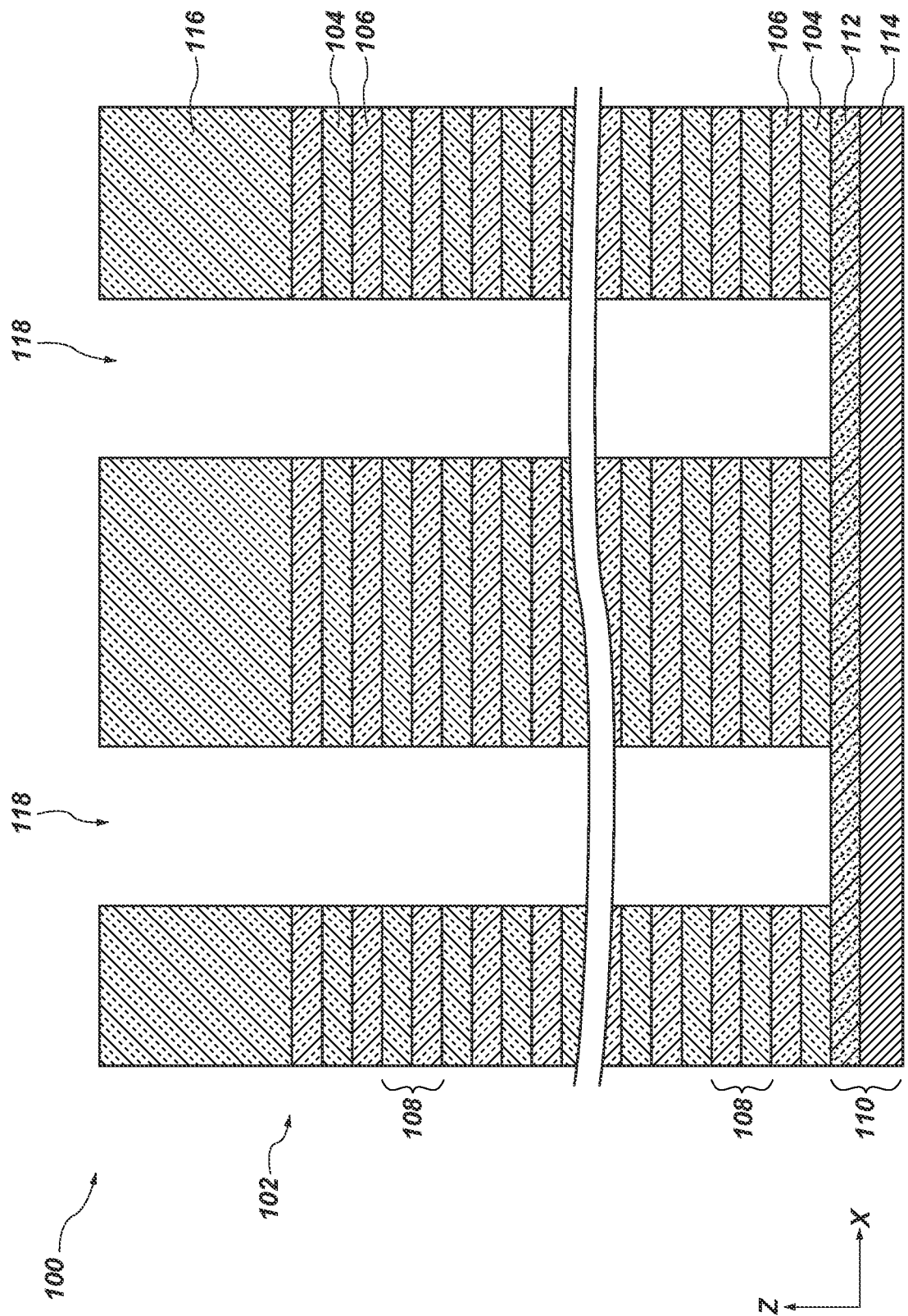
FIG. 1A through FIG. 1P are simplified cross-sectional views (FIG. 1A, FIG. 1C, FIG. 1E through FIG. 1K, and FIG. 1M through FIG. 1P) and simplified top-down views (FIG. 1B, FIG. 1D, and FIG. 1L) illustrating a method of forming a microelectronic device, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a semiconductor device, a memory device, such as DRAM memory device), apparatus, memory device, or electronic system, or a complete microelectronic device, apparatus, memory device, or electronic system including some conductive structures (e.g., select gate structures) exhibiting a greater conductivity than other conductive structures. The structures described below do not form a complete microelectronic device, apparatus, memory device, or electronic system. Only those process acts and structures necessary to understand the embodiments described herein are described in detail below. Additional acts to form a complete microelectronic device, apparatus, memory device, or electronic system from the structures may be performed by conventional techniques.

Unless otherwise specified, materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "neighboring" one another means and includes features of the disclosed identity (or identities) that are located most proximate (e.g., closest to) one another. Additional features (e.g., additional regions, additional materials, additional structures, additional devices) not matching the disclosed identity (or identities) of the "neighboring" features may be disposed between the "neighboring" features. Put another way, the "neighboring" features may be positioned directly adjacent one another, such that no other feature intervenes between the "neighboring" features; or the "neighboring" features may be positioned indirectly adjacent one another, such that at least one feature having an identity other than that associated with at least one the "neighboring" features is positioned between the "neighboring" features. Accordingly, features described as "vertically neighboring" one another means and includes features of the disclosed identity (or identities) that are located most vertically proximate (e.g., vertically closest to) one another. Moreover, features described as "horizontally neighboring" one another means and includes features of the disclosed identity (or identities) that are located most horizontally proximate (e.g., horizontally closest to) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including an insulative material.

As used herein, the term "void" means and includes a volume a gap or space between neighboring structures or features. The void does is not necessarily devoid of a material within its boundaries and may, for example, contain a gaseous species, such as one or both of air or an inert gas, or a vacuum.

According to embodiments described herein, a microelectronic device comprises a stack structure including an alternating sequence of insulative structures and conductive structures. Strings of memory cells vertically extend through the stack structure. A conductive contact vertically overlies each string of the strings of memory cells and is in electrical communication with a channel material of each string. Each conductive contact is laterally surrounded by a void located within lateral boundaries defined by the respective string of memory cells. A conductive line is in electrical communication with the conductive material. The void laterally surrounding the conductive contact may reduce capacitive coupling between the conductive contact and laterally neighboring conductive contacts and may reduce bit line loading of bit lines electrically coupled to the conductive contacts.

The microelectronic device may be formed by forming openings through a dielectric material and a stack structure comprising an alternating sequence of insulative structure and additional insulative structures. One or more memory cell materials and a channel material may be formed on sidewalls of the dielectric material and the stack structure exposed by the openings. Remaining portions of the openings may be filled with an insulative material to form pillars. A portion of the insulative material may be recessed through to form recesses and a first conductive material is formed within the recesses of the pillars. A second conductive material fills remaining portions of the recesses. Portions of the first conductive material are selectively removed to form voids between the second conductive material and sidewalls of the dielectric material or vertically extending portions of the one or more memory cell materials. In some embodiments, one or more of the memory cell materials are removed to increase a lateral dimension of the voids. One or more dielectric material are formed over the voids and conductive lines are formed in electrical communication with the second conductive material.

Figure 1C:
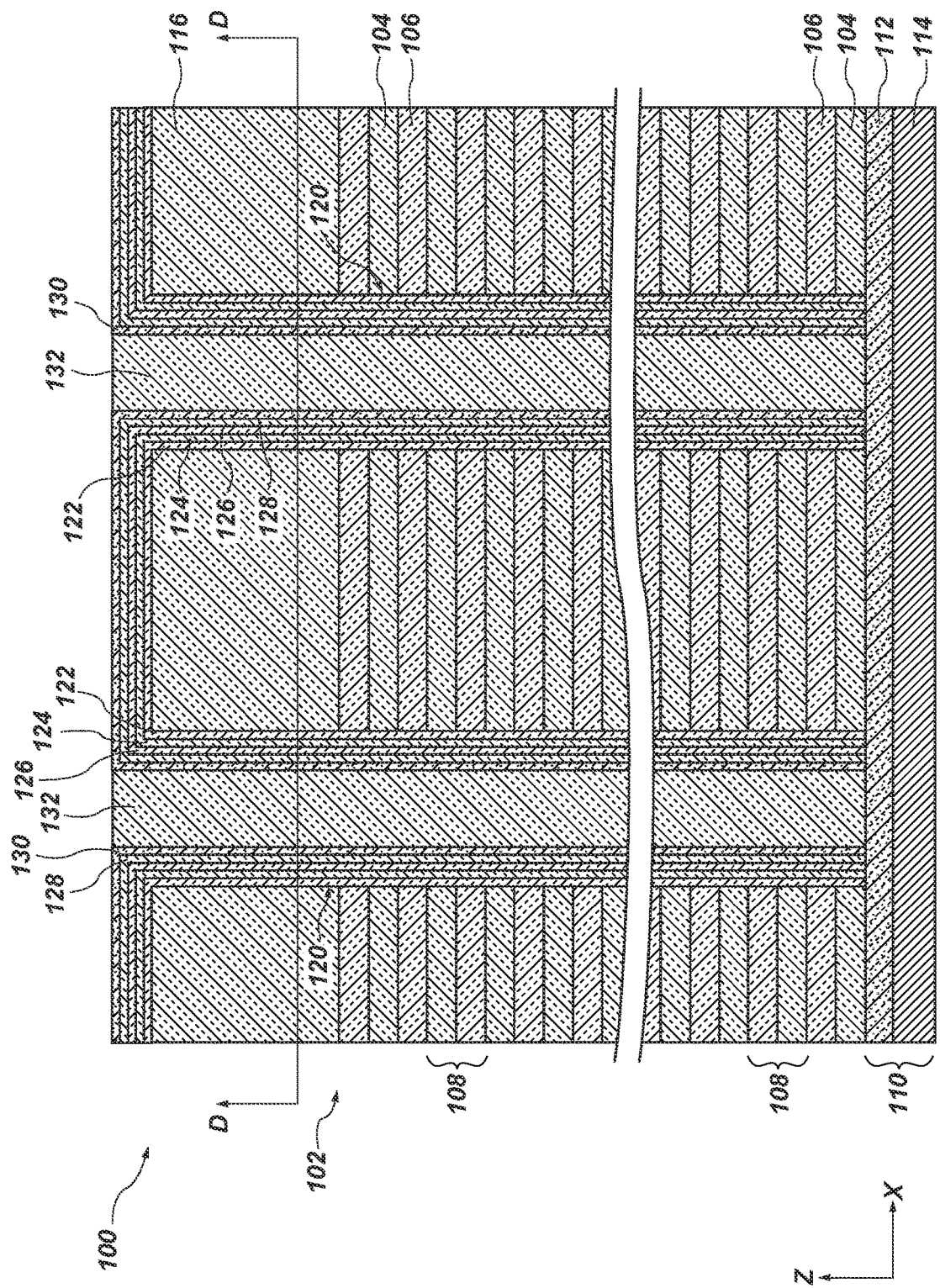
Figure 1D:
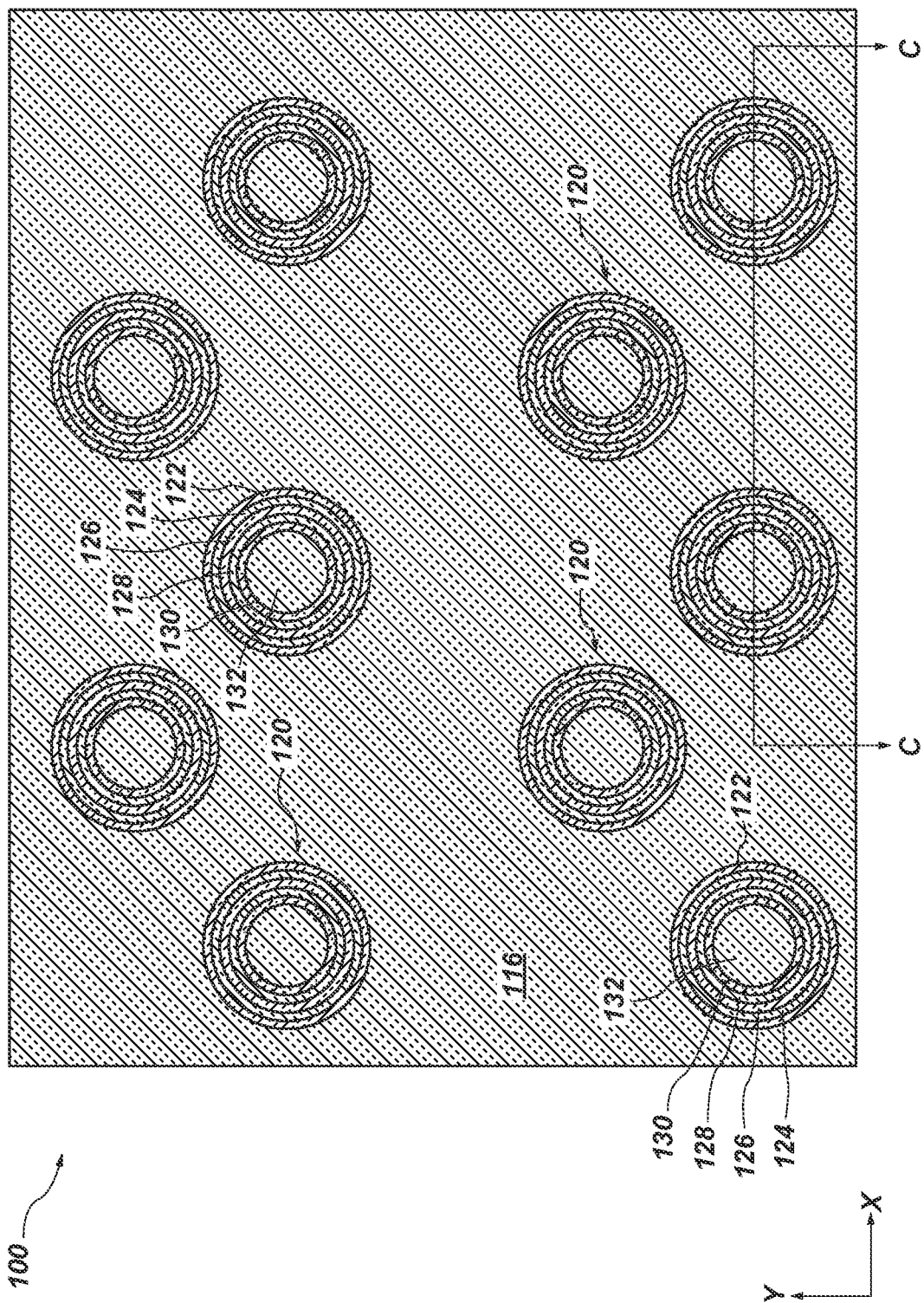
Figure 1E:
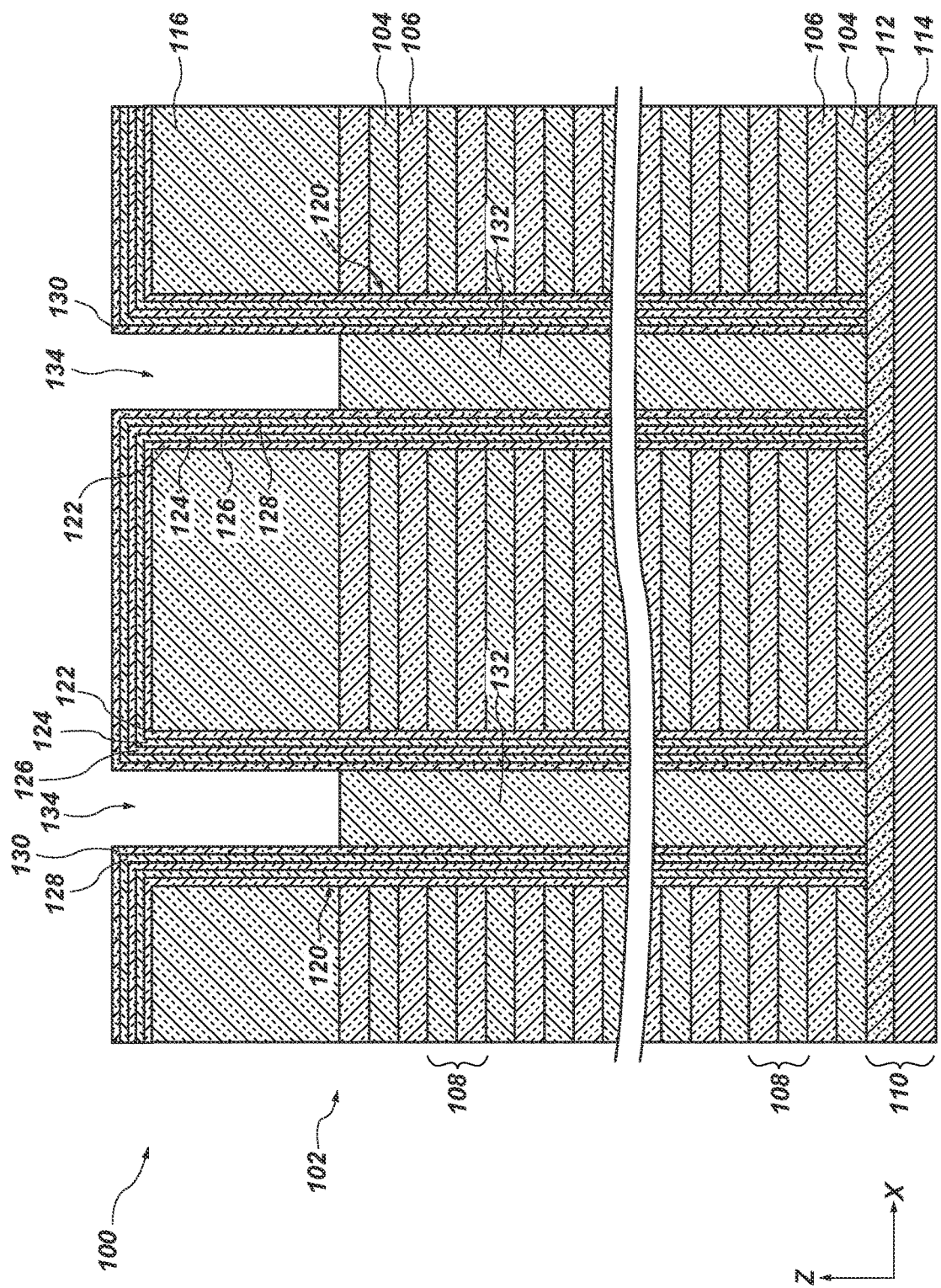
Figure 1F:
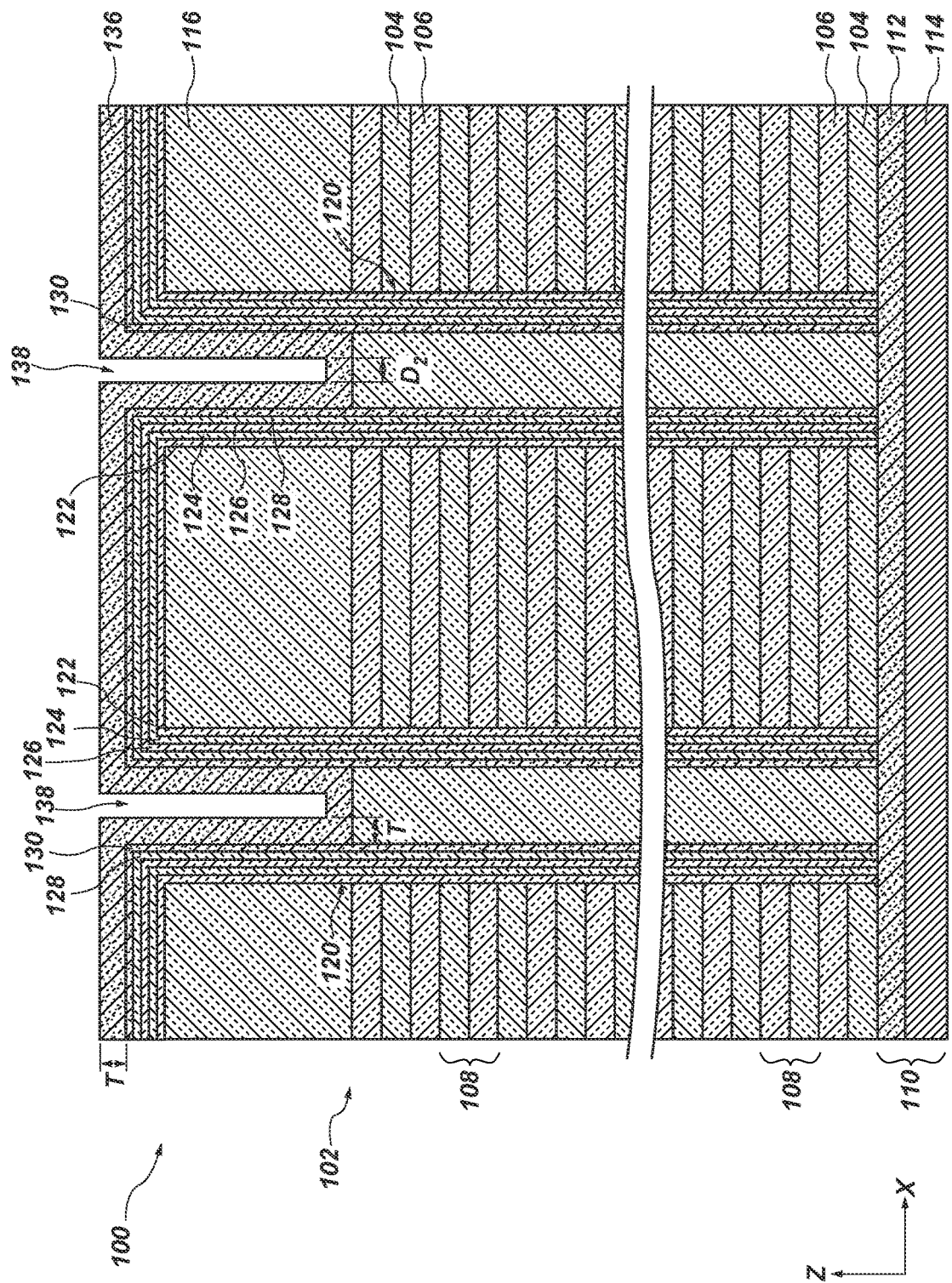
Figure 1G:
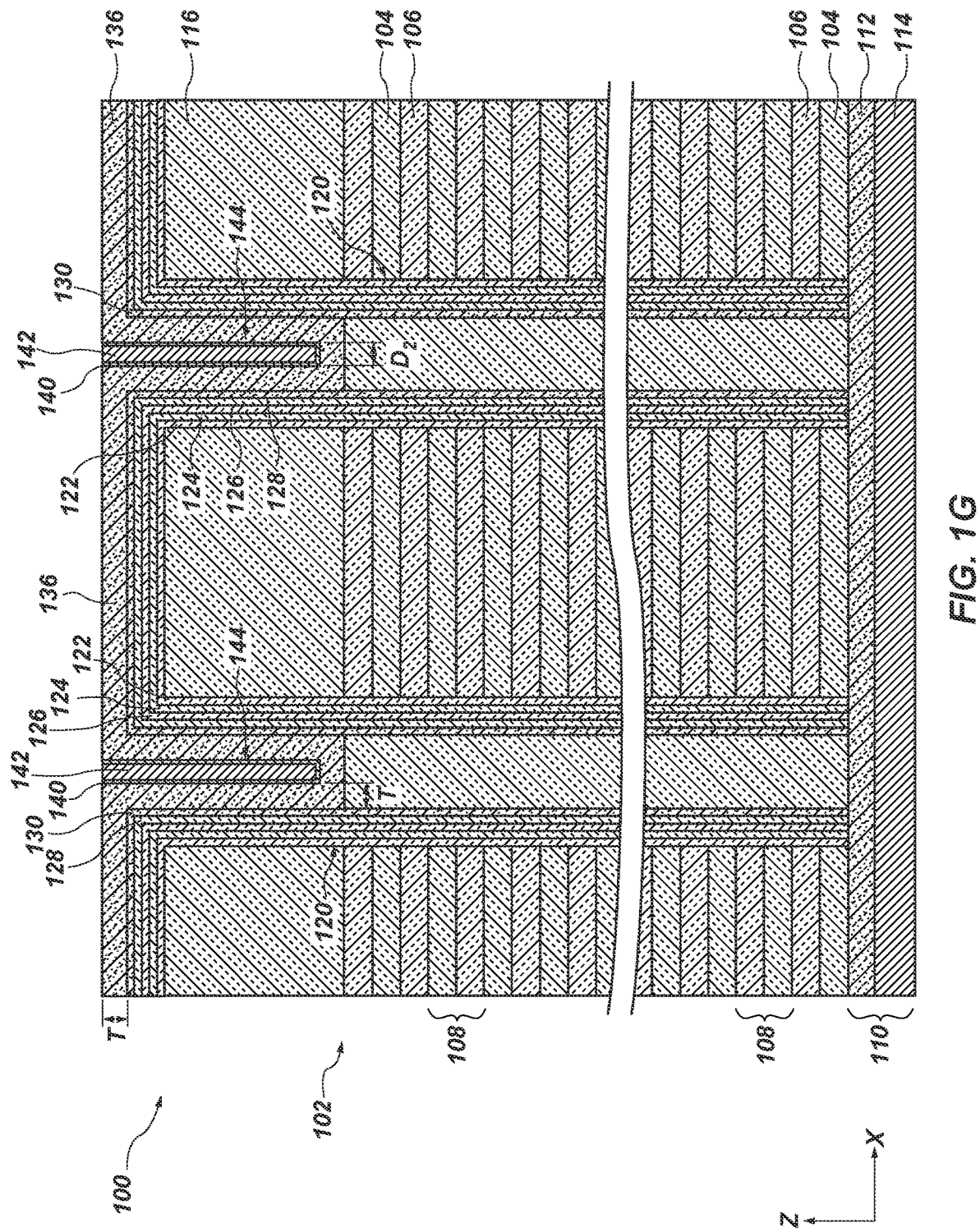
Figure 1H:
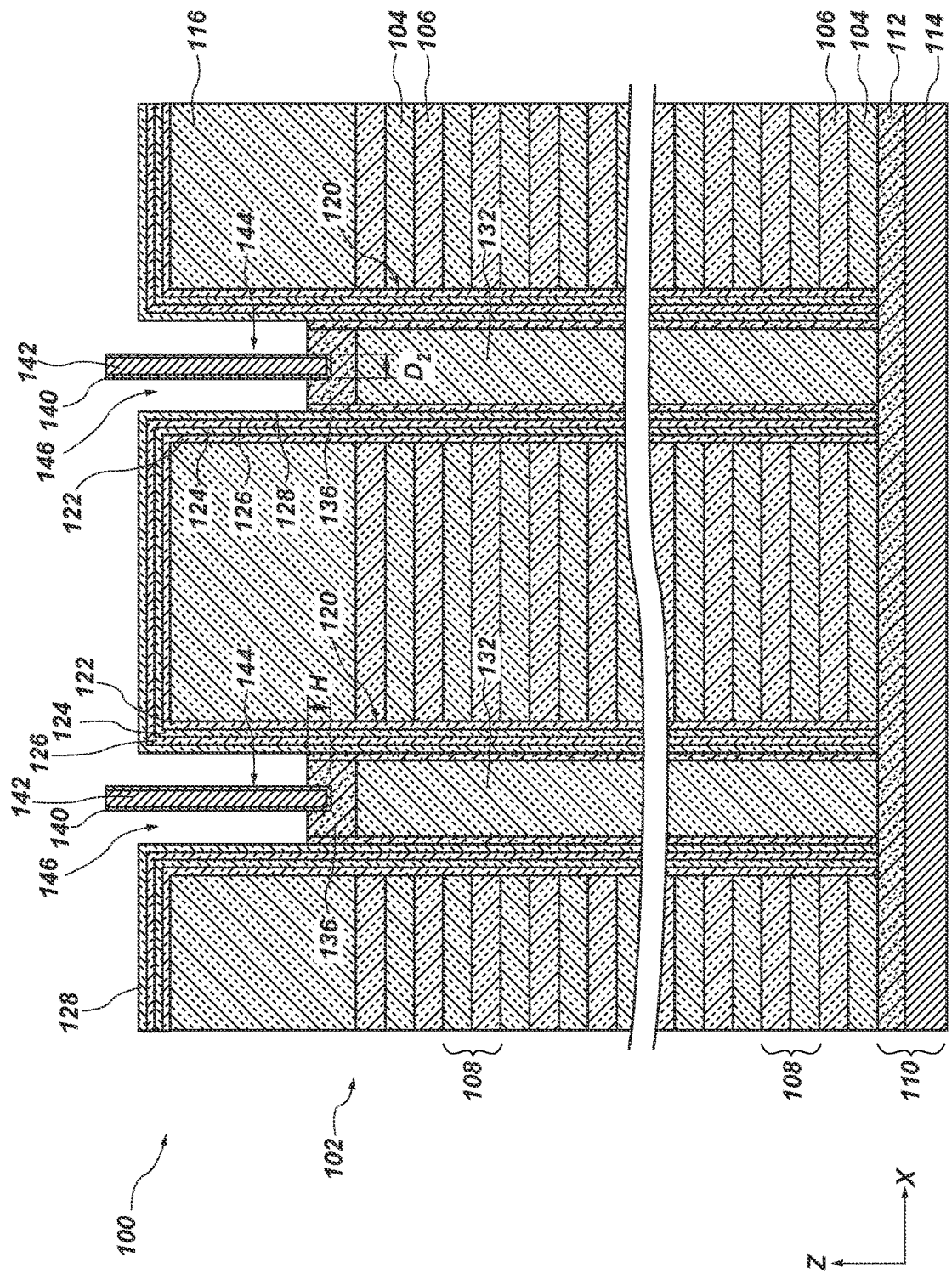
Figure 11:
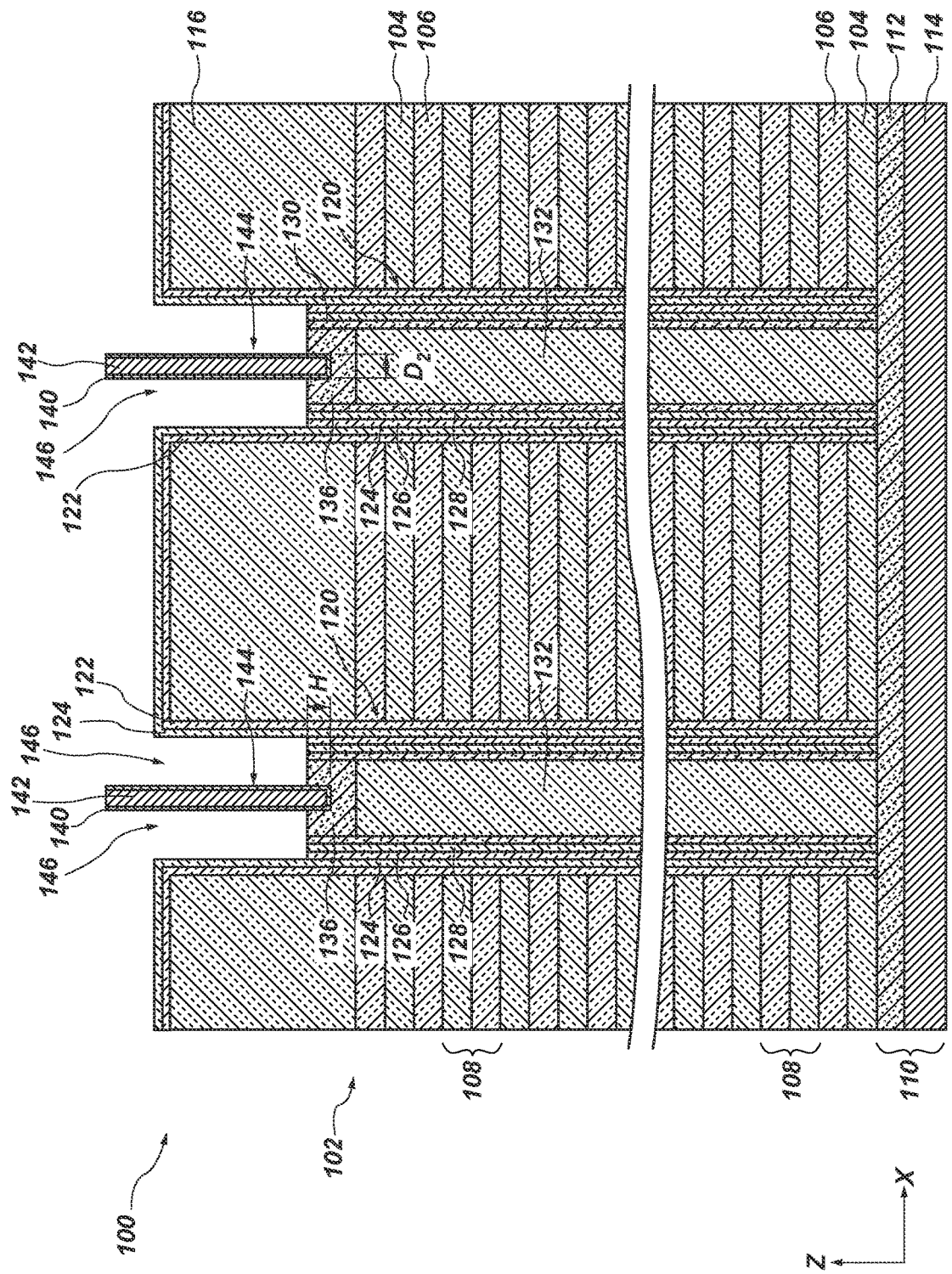
Figure 1J:
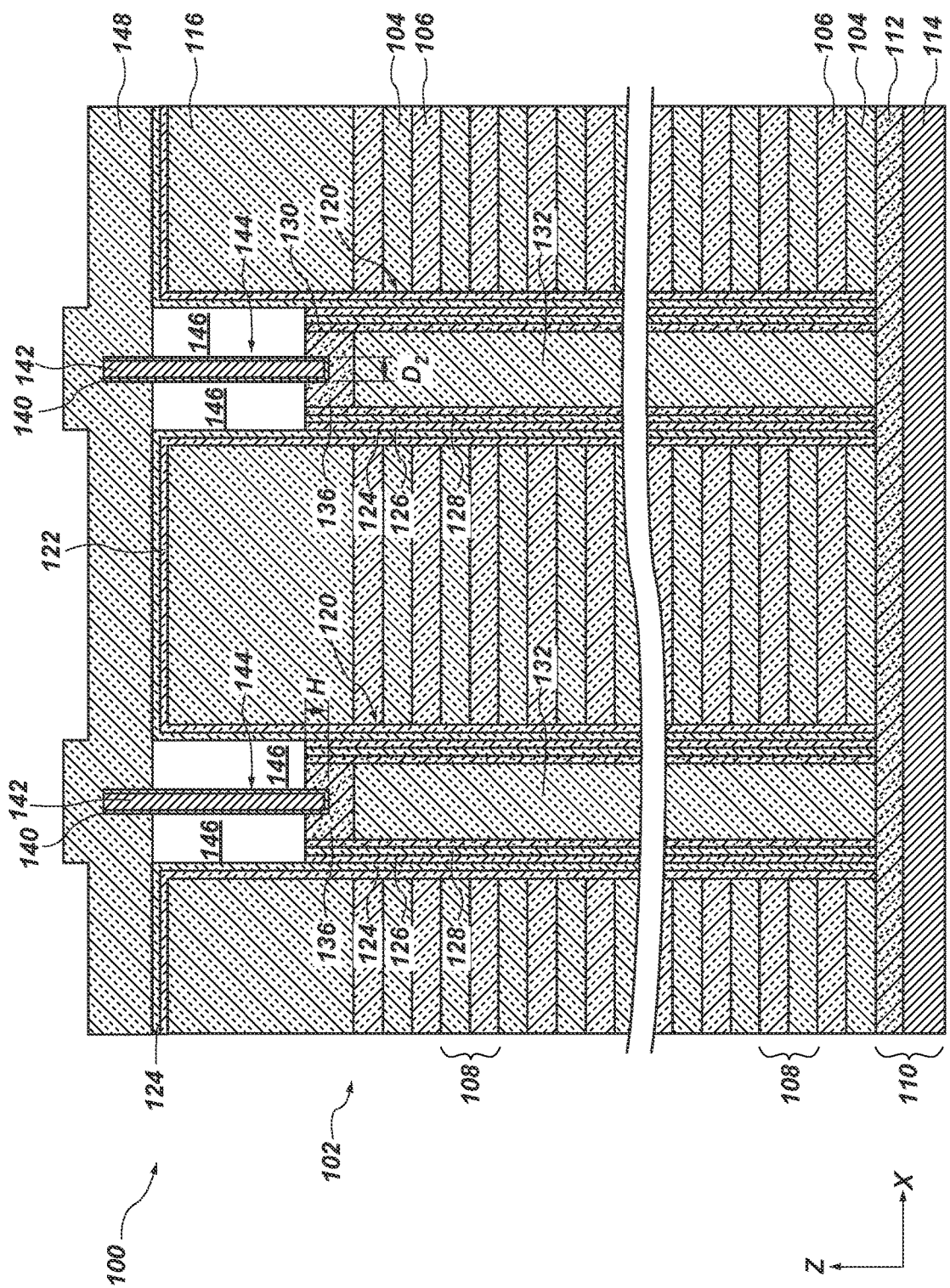
Figure 1K:
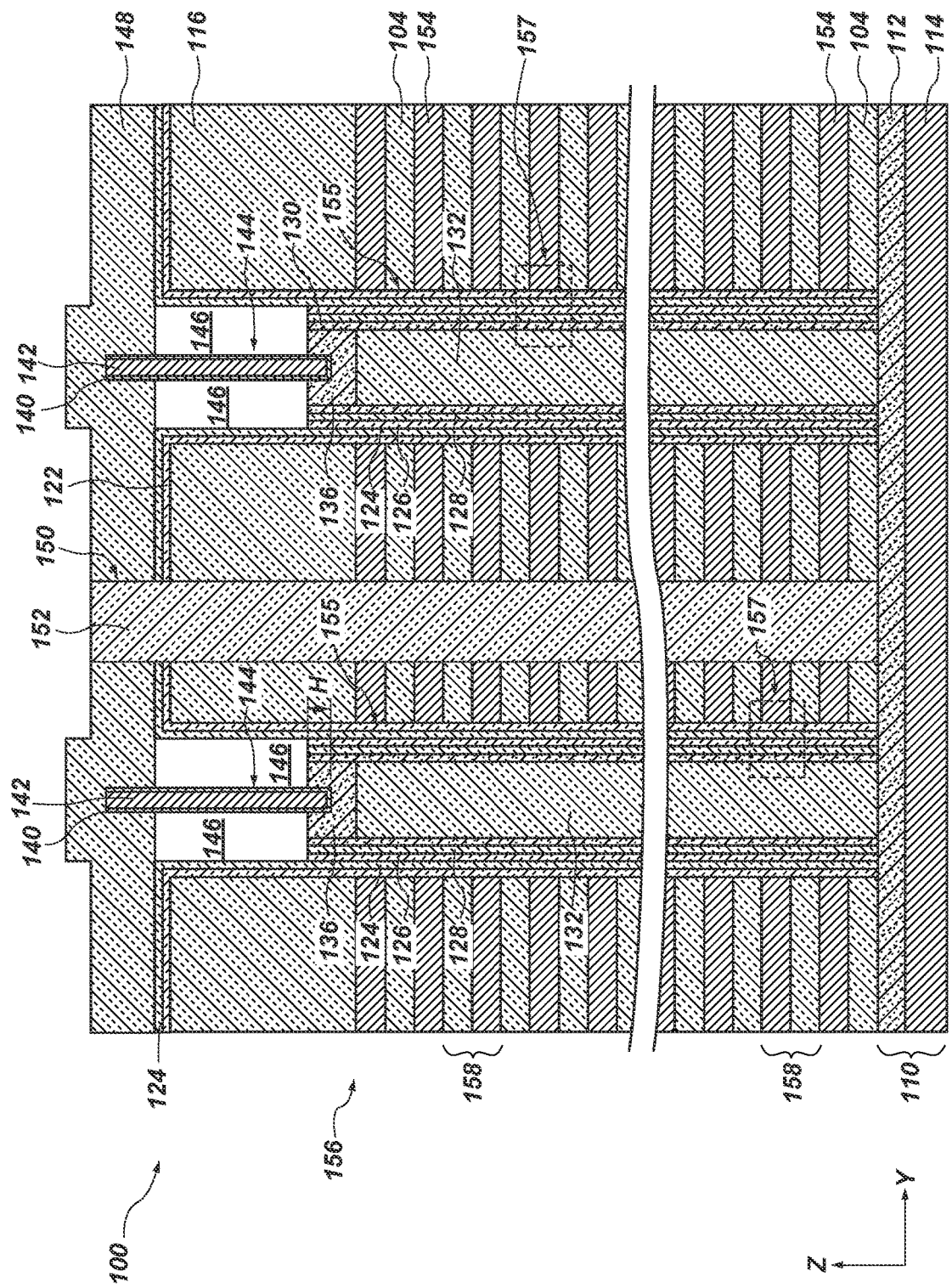
Figure 1L:
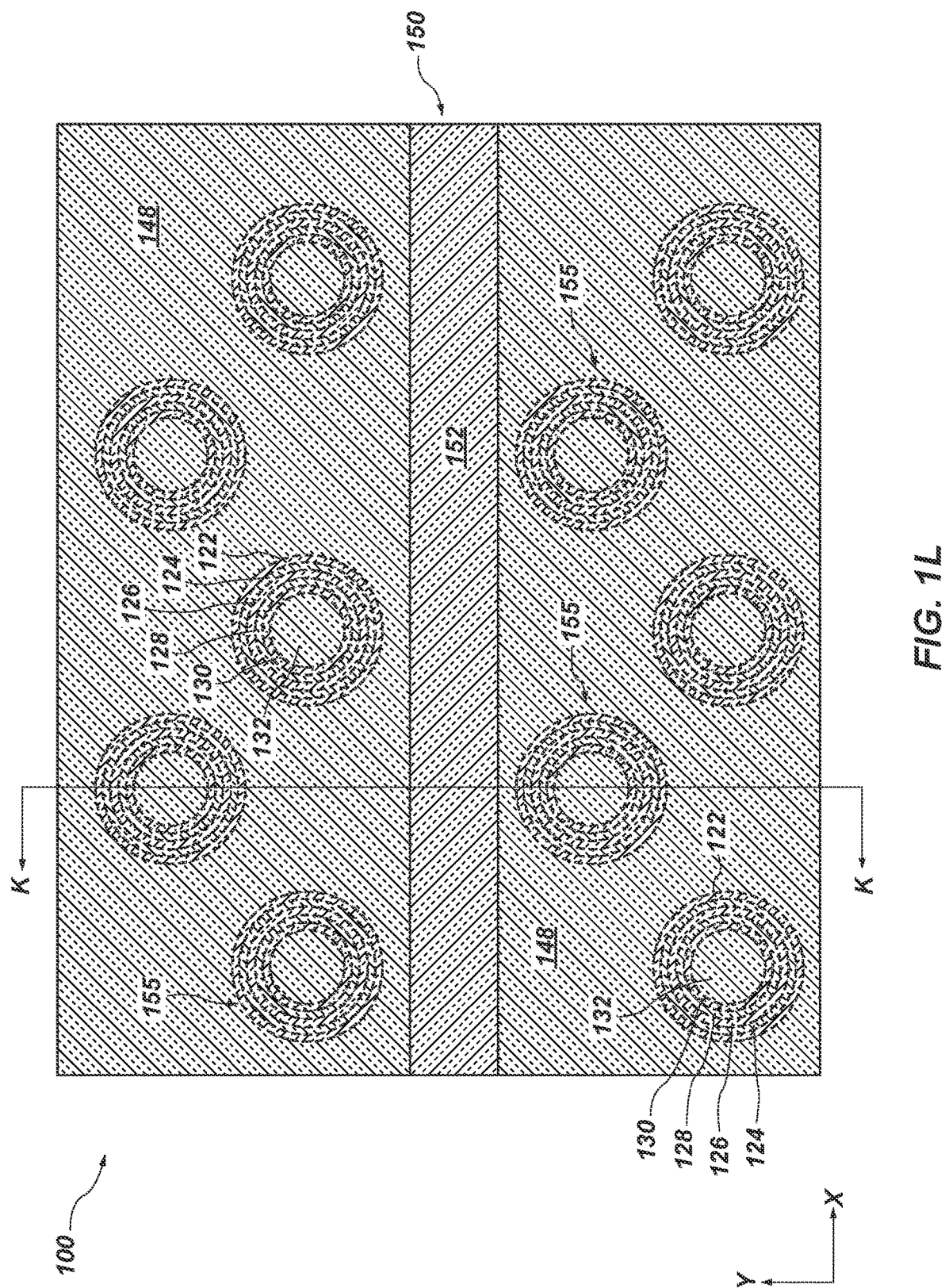
Figure 1M:
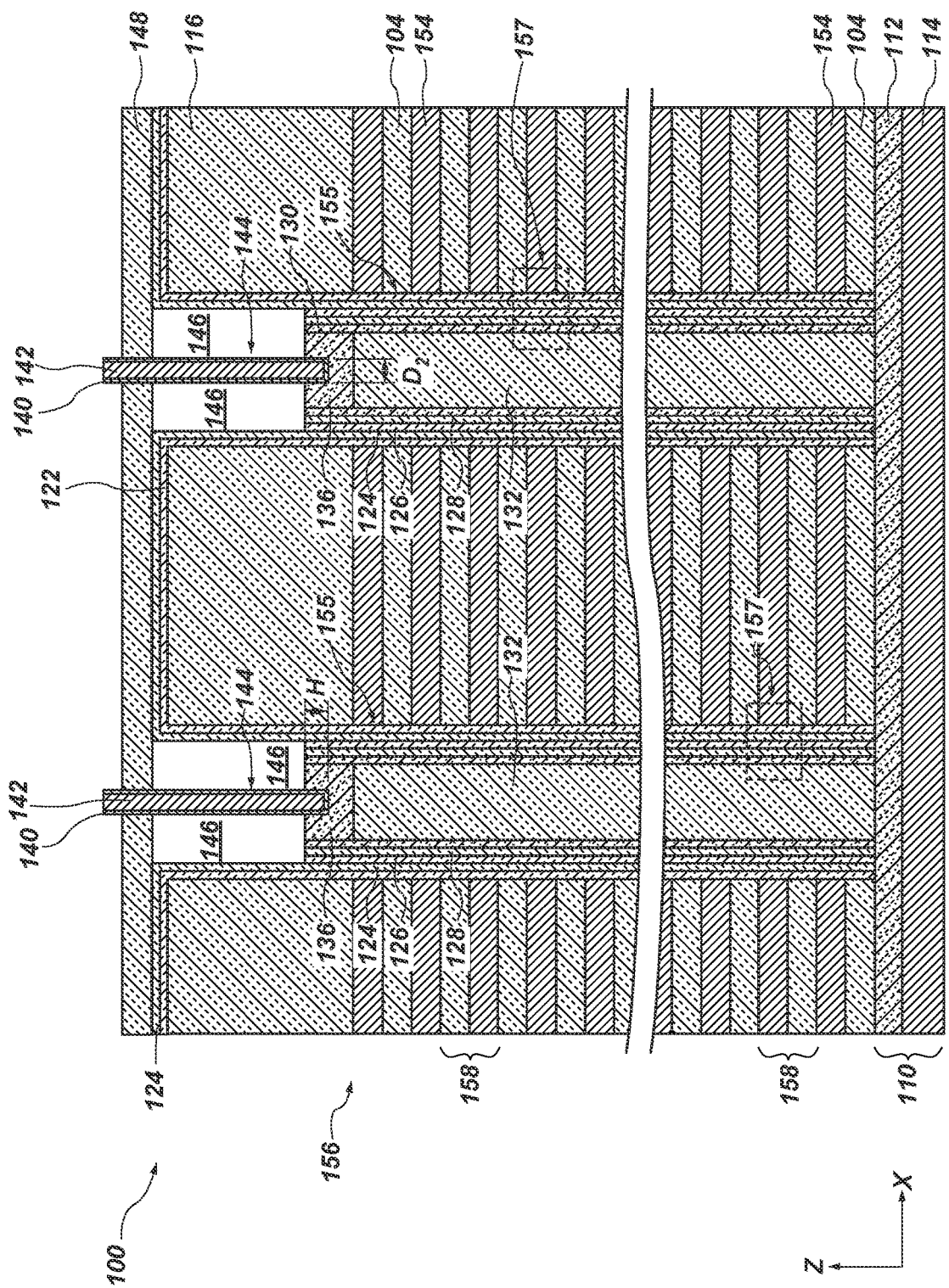
Figure 1N:
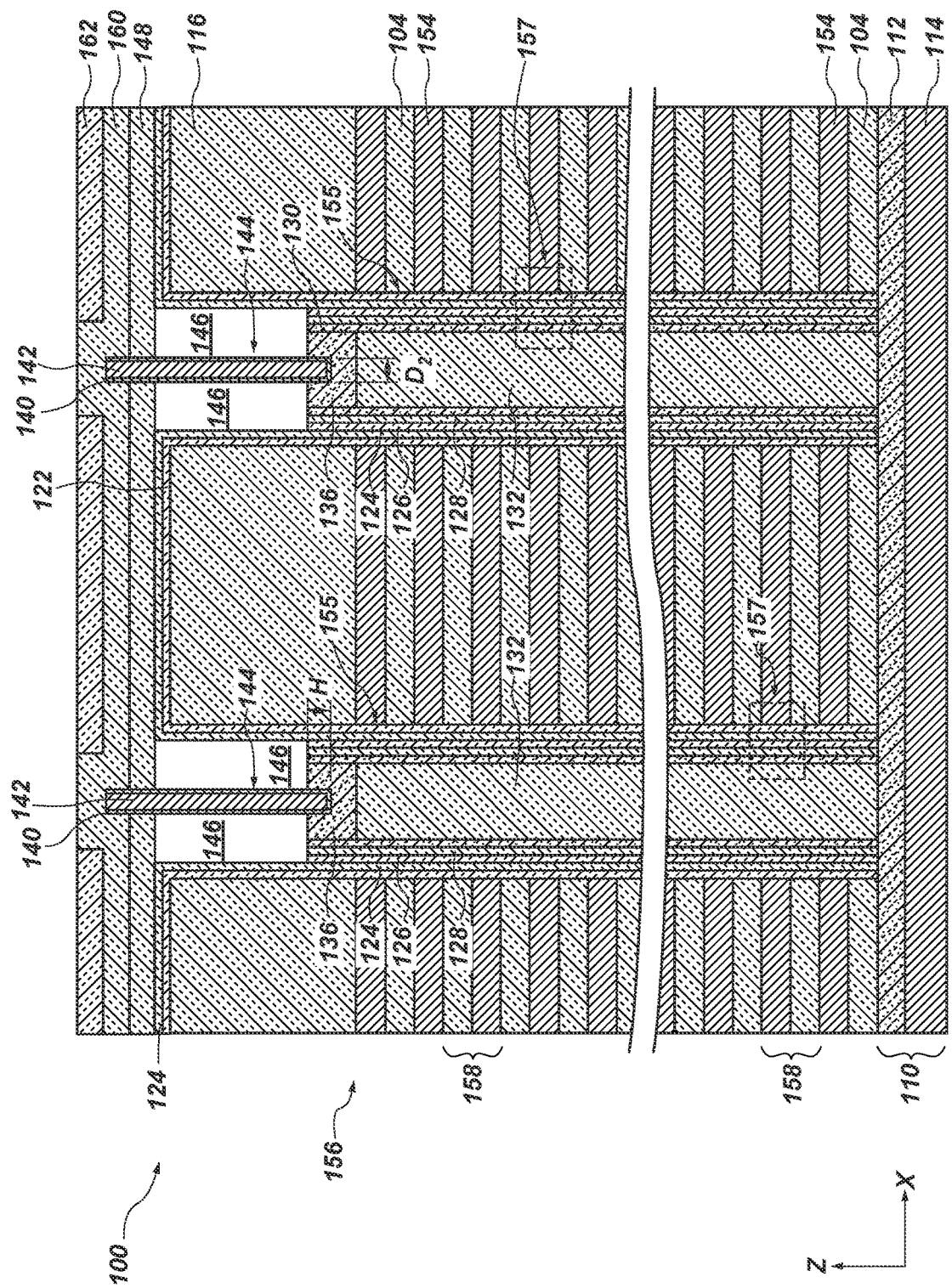
Figure 10:
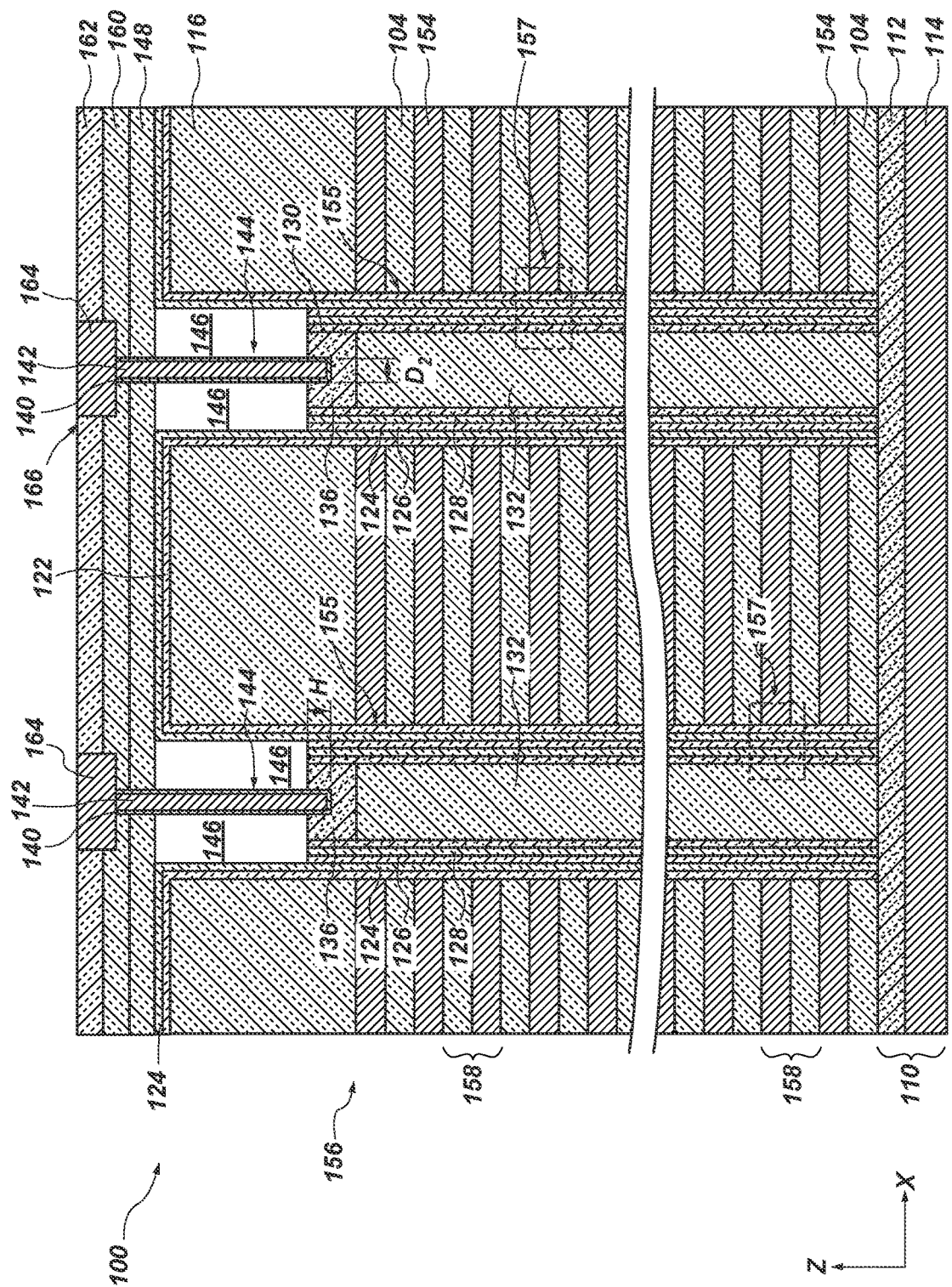
Figure 1P:
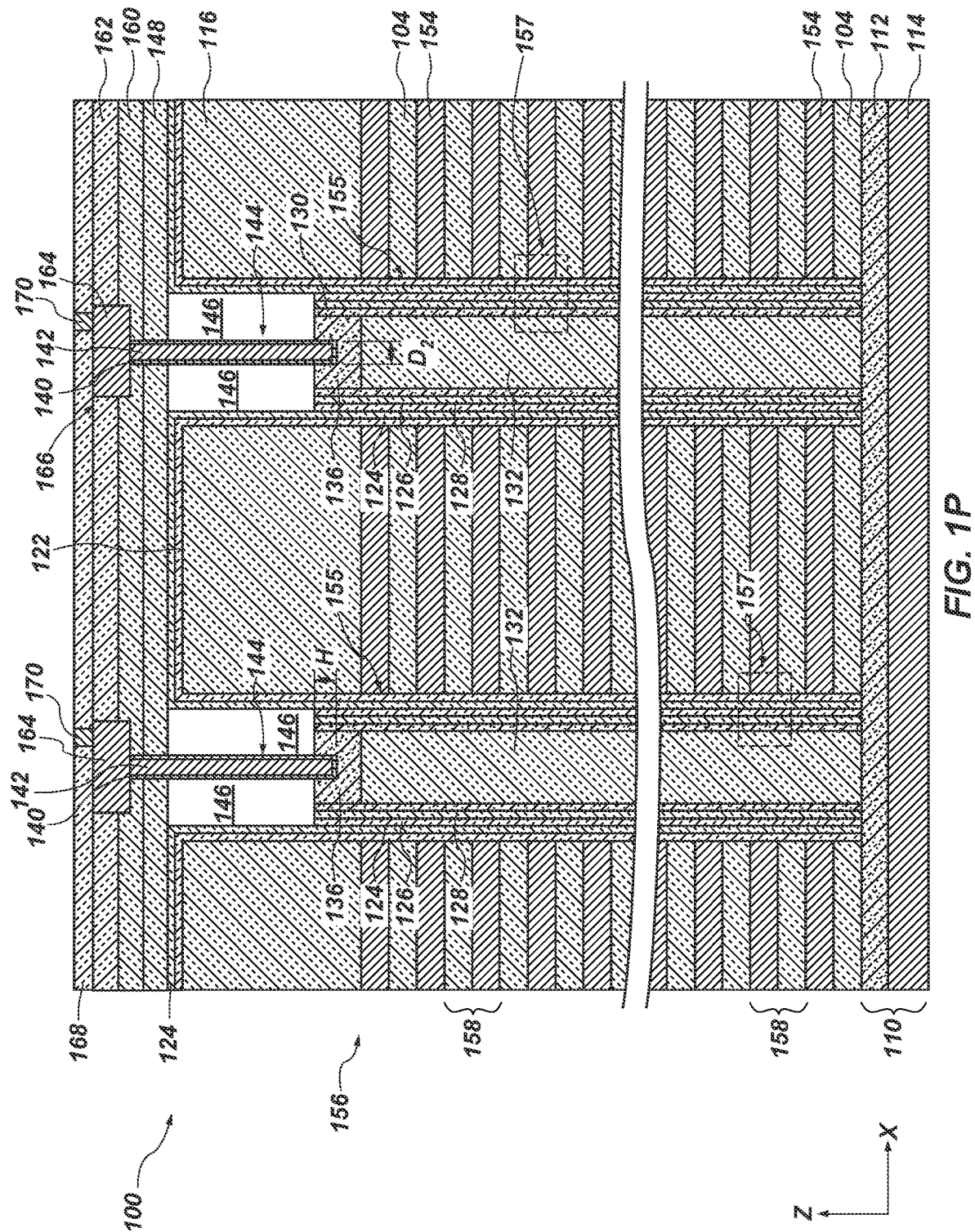

FIG. 1A through FIG. 1P illustrate a method of forming a microelectronic device structure, in accordance with embodiments of the disclosure. FIG. 1A is a simplified cross-sectional view of a microelectronic device structure 100 taken through section line A-A of FIG. 1B. The microelectronic device structure 100 may, for example, be formed into a portion of a memory device (e.g., a multi-deck 3D NAND Flash memory device, such as a dual deck 3D NAND Flash memory device), as described in further detail below.

With reference to FIG. 1A and FIG. 1B, the microelectronic device structure 100 includes a stack structure 102 including a vertically alternating (e.g., in the Z-direction) sequence of insulative structures 104 and additional insulative structures 106 arranged in tiers 108. Each of the tiers 108 of the stack structure 102 may include at least one (1) of the insulative structures 104 vertically neighboring at least one (1) of the additional insulative structures 106.

The insulative structures 104 may each individually be formed of and include, for example, an insulative material, such as one or more of an oxide material (e.g., silicon dioxide ($SiO_2$), phosphosilicate glass, borosilicate glass, borophosphosilicate glass, fluorosilicate glass, titanium dioxide ($TiO_2$), hafnium oxide ($HfO_2$), zirconium dioxide ($ZrO_2$), hafnium dioxide ($HfO_2$), tantalum oxide ($TaO_2$), magnesium oxide (MgO), aluminum oxide ($Al_2O_3$), or a combination thereof), and amorphous carbon. In some embodiments, the insulative structures 104 comprise silicon dioxide. Each of the insulative structures 104 may individually include a substantially homogeneous distribution of the at least one insulating material, or a substantially heterogeneous distribution of the at least one insulating material. As used herein, the term "homogeneous distribution" means amounts of a material do not vary throughout different portions (e.g., different horizontal portions, different vertical portions) of a structure. Conversely, as used herein, the term "heterogeneous distribution" means amounts of a material vary throughout different portions of a structure. Amounts of the material may vary stepwise (e.g., change abruptly), or may vary continuously (e.g., change progressively, such as linearly, parabolically) throughout different portions of the structure. In some embodiments, each of the insulative structures 104 of each of the tiers 108 of the stack structure 102 exhibits a substantially homogeneous distribution of insulative material. In additional embodiments, at least one of the insulative structures 104 of at least one of the tiers 108 of the stack structure 102 exhibits a substantially heterogeneous distribution of at least one insulative material. The insulative structures 104 may, for example, be formed of and include a stack (e.g., laminate) of at least two different insulative materials. The insulative structures 104 of each of the tiers 108 of the stack structure 102 may each be substantially planar, and may each individually exhibit a desired thickness.

The levels of the additional insulative structures 106 may be formed of and include an insulative material that is different than, and exhibits an etch selectivity with respect to, the insulative structures 104. In some embodiments, the additional insulative structures 106 are formed of and include a nitride material (e.g., silicon nitride ($Si_3N_4$)) or an oxynitride material (e.g., silicon oxynitride). In some embodiments, the additional insulative structures 106 comprise silicon nitride.

Although FIG. 1A illustrates a particular number of tiers 108 of the insulative structures 104 and the additional insulative structures 106, the disclosure is not so limited. In some embodiments, the stack structure 102 includes a desired quantity of the tiers 108, such as within a range from thirty-two (32) of the tiers 108 to 256 of the tiers 108. In some embodiments, the stack structure 102 includes sixty-four (64) of the tiers 108. In other embodiments, the stack structure 102 includes a different number of the tiers 108, such as less than sixty-four (64) of the tiers 108 (e.g., less than or equal to sixty (60) of the tiers 108, less than or equal to fifty (50) of the tiers 108, less than about forty (40) of the tiers 108, less than or equal to thirty (30) of the tiers 108, less than or equal to twenty (20) of the tiers 108, less than or equal to ten (10) of the tiers 108); or greater than sixty-four (64) of the tiers 108 (e.g., greater than or equal to seventy (70) of the tiers 108, greater than or equal to one hundred (100) of the tiers 108, greater than or equal to about one hundred twenty-eight (128) of the tiers 108, greater than two hundred fifty-six (256) of the tiers 108) of the insulative structures 104 and the additional insulative structures 106. In addition, in some embodiments, the stack structure 102 overlies a deck structure comprising additional tiers 108 of insulative structures 104 and the additional insulative structures, separated from the stack structure 102 by at least one dielectric material, such as an interdeck insulative material.

With continued reference to FIG. 1A, the microelectronic device structure 100 further includes a source tier 110 vertically underlying (e.g., in the Z-direction) the stack structure 102. The source tier 110 may comprise, for example, a first source material 112 and a second source material 114. The first source material 112 may be formed of and include at least one conductive material, such as one or more of a metal (e.g., W, Ti, Mo, Nb, V, Hf, Ta, Cr, Zr, Fe, Ru, Os, Co, Rh, Ir, Ni, Pd, Pt, Cu, Ag, Au, Al), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a Mg-based alloy, a Ti-based alloy), a conductive metal-containing material (e.g., a conductive metal nitride, a conductive metal silicide, a conductive metal carbide, a conductive metal oxide), or a doped semiconductor material (e.g., a semiconductor material doped with one or more P-type dopants (e.g., polysilicon doped with at least one P-type dopant, such as one or more of boron, aluminum, and gallium) or one or more N-type conductivity materials (e.g., polysilicon doped with at least one N-type dopant, such as one or more of arsenic, phosphorous, antimony, and bismuth)). In some embodiments, the first source material 112 comprises conductively-doped silicon.

The second source material 114 may be formed of and include one or more of a metal silicide material (e.g., tungsten silicide ($WSi_x$)), a metal nitride material (e.g., tungsten nitride), and a metal silicon nitride material (e.g., tungsten silicon nitride ($WSi_xN_y$)). In some embodiments, the second source material 114 comprises tungsten silicide.

A dielectric material 116 may vertically overlie the stack structure 102 and may be located over an uppermost one of the tiers 108. The dielectric material 116 may be formed of and include an electrically insulative material, such as, for example, one or more of phosphosilicate glass (PSG), borosilicate glass (BSG), fluorosilicate glass (FSG), borophosphosilicate glass (BPSG), and silicon dioxide. In some embodiments, the dielectric material 116 comprises substantially the same material composition as the insulative structures 104. In some embodiments, the dielectric material 116 comprises silicon dioxide.

Openings 118 may be formed through the stack structure 102 to, for example, expose a portion of the source tier 110 (e.g., a portion of the first source material 112). As will be described herein, the openings 118 may be used to form pillars 120 (FIG. 1C) for forming strings (FIG. 1K) of memory cells 157 (FIG. 1K).

Referring to FIG. 1B, openings 118 that laterally neighbor one another in the Y-direction may be offset from each other in the X-direction. Accordingly, the openings 118 may be arranged in a so-called weave pattern, which may facilitate an increased density of the pillars 120 (and the resulting strings (e.g., strings 155 (FIG. 1K)) of memory cells (e.g., memory cells 157 (FIG. 1K))) to be formed in the openings 118. However, the disclosure is not so limited and the openings 118 may be arranged in other patterns (e.g., lines wherein the openings 118 of each line are aligned with openings 118 of each of the other lines). In some embodiments, each opening 118 may be surrounded by six (6) other openings 118 and may be arranged in a hexagonal pattern.

The openings 118 may have a horizontal dimension (e.g., diameter) $D_1$ within a range from about 60 nanometers (nm) to about 120 nm, such as from about 60 nm to about 80 nm, from about 80 nm to about 100 nm, or from about 100 nm to about 120 nm. In some embodiments, the horizontal dimension $D_1$ is about 100. However, the disclosure is not so limited and the horizontal dimension $D_1$ may be different than those described.

Referring to FIG. 1C and FIG. 1D, after forming the openings 118, one or more materials may be formed within the openings to form pillars 120 including the one or more materials. FIG. 1C is a simplified cross-sectional view of the microelectronic device structure 100 taken through section line C-C of FIG. 1D, which is a simplified top view of the microelectronic device structure 100. With reference to FIG. 1C and FIG. 1D, the pillars 120 may vertically extend (e.g., in the Z-direction) through the stack structure 102. As will be described herein, the materials of the pillars 120 may be employed to form memory cells (e.g., strings of NAND memory cells). The pillars 120 may each individually comprise a barrier material 122 horizontally neighboring the levels of the insulative structures 104 and the additional insulative structures 106 of one of the tiers 108 of the stack structure 102; a charge blocking material (also referred to as a "dielectric blocking material") 124 horizontally neighboring the barrier material 122; a memory material 126 horizontally neighboring the charge blocking material 124; a tunnel dielectric material (also referred to as a "tunneling dielectric material") 128 horizontally neighboring the memory material 126; a channel material 130 horizontally neighboring the tunnel dielectric material 128; and an insulative material 132 in a center portion of the pillars 120. The channel material 130 may be horizontally interposed between the insulative material 132 and the tunnel dielectric material 128; the tunnel dielectric material 128 may be horizontally interposed between the channel material 130 and the memory material 126; the memory material 126 may be horizontally interposed between the tunnel dielectric material 128 and the charge blocking material 124; the charge blocking material 124 may be horizontally interposed between the memory material 126 and the barrier material 122; and the barrier material 122 may be horizontally interposed between the charge blocking material 124 and the levels of the insulative structures 104 and additional insulative structures 106.

The barrier material 122, the charge blocking material 124, the memory material 126, and the tunnel dielectric material 128 may collectively be referred to herein as "memory cell materials."

In some embodiments, the pillars 120 do not include the barrier material 122 and the charge blocking material 124 horizontally neighbors the levels of the insulative structures 104 and additional insulative structures 106.

The insulative material 132 may be formed of and include an electrically insulative material such as, for example, phosphosilicate glass (PSG), borosilicate glass (BSG), fluorosilicate glass (FSG), borophosphosilicate glass (BPSG), silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), a dielectric carbon nitride material (e.g., silicon carbon nitride (SiCN)), a dielectric carboxynitride material (e.g., silicon carboxynitride (SiOCN)), or combinations thereof. In some embodiments, the insulative material 132 comprises silicon dioxide.

The channel material 130 may be formed of and include one or more of a semiconductor material (at least one elemental semiconductor material, such as polycrystalline silicon; at least one III-V compound semiconductor material, at least one II-VI compound semiconductor material, at least one organic semiconductor material, GaAs, InP, GaP, GaN, other semiconductor materials), and an oxide semiconductor material. In some embodiments, the channel material 130 includes amorphous silicon or polysilicon. In some embodiments, the channel material 130 comprises a doped semiconductor material.

A thickness (e.g., in the X-direction and in the Y-direction) of the channel material 130 may be within a range from about 5 nm to about 15 nm, such as from about 5 nm to about 15 nm, such as from about 5 nm to about 10 nm, or form about 10 nm to about 15 nm. However, the disclosure is not so limited and the thickness of the channel material 130 may be different than that described above.

The tunnel dielectric material 128 may be formed of and include a dielectric material through which charge tunneling can be performed under suitable electrical bias conditions, such as through hot-carrier injection or by Fowler-Nordheim tunneling induced charge transfer. By way of non-limiting example, the tunnel dielectric material 128 may be formed of and include one or more of silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In some embodiments, the tunnel dielectric material 128 comprises silicon dioxide. In other embodiments, the tunnel dielectric material 128 comprises nitrogen, such as an oxynitride. In some such embodiments, the tunnel dielectric material 128 comprises silicon oxynitride.

A thickness (e.g., in the X-direction and in the Y-direction) of the tunnel dielectric material 128 may be within a range from about 4 nm to about 10 nm, such as from about 4 nm to about 6 nm, from about 6 nm to about 8 nm, or from about 8 nm to about 10 nm. However, the disclosure is not so limited and the thickness of the tunnel dielectric material 128 may be different than that described above.

The memory material 126 may comprise a charge trapping material or a conductive material. The memory material 126 may be formed of and include one or more of silicon nitride, silicon oxynitride, polysilicon (doped polysilicon), a conductive material (tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), a semiconductive material polycrystalline or amorphous semiconductor material including at least one elemental semiconductor element or at least one compound semiconductor material, conductive nanoparticles (e.g., ruthenium nanoparticles), metal dots. In some embodiments, the memory material 126 comprises silicon nitride.

A thickness (e.g., in the X-direction and in the Y-direction) of the memory material 126 may be within a range from about 4 nm to about 10 nm, such as from about 4 nm to about 6 nm, from about 6 nm to about 8 nm, or from about 8 nm to about 10 nm. However, the disclosure is not so limited and the thickness of the memory material 126 may be different than that described above.

The charge blocking material 124 may be formed of and include a dielectric material such as, for example, one or more of an oxide (e.g., silicon dioxide), a nitride (silicon nitride), and an oxynitride (silicon oxynitride), or another material. In some embodiments, the charge blocking material 124 comprises silicon oxynitride.

A thickness (e.g., in the X-direction and in the Y-direction) of the charge blocking material 124 may be within a range from about 4 nm to about 12 nm, such as from about 4 nm to about 6 nm, from about 6 nm to about 8 nm, from about 8 nm to about 10 nm, or from about 10 nm to about 12 nm. However, the disclosure is not so limited and the thickness of the charge blocking material 124 may be different than that described above.

In some embodiments the tunnel dielectric material 128, the memory material 126, and the charge blocking material 124 together may comprise a structure configured to trap a charge, such as, for example, an oxide-nitride-oxide (ONO) structure. In some such embodiments, the tunnel dielectric material 128 comprises silicon dioxide, the memory material 126 comprises silicon nitride, and the charge blocking material 124 comprises silicon dioxide. In other embodiments, the tunnel dielectric material 128, the memory material 126, and the charge blocking material 124 together comprise an oxide-nitride-oxynitride structure. In some such embodiments, the tunnel dielectric material 128 comprises silicon oxynitride, the memory material 126 comprises silicon nitride, and the charge blocking material 124 comprises silicon dioxide.

The barrier material 122 may be formed of and include one or more of a metal oxide (e.g., one or more of aluminum oxide, hafnium oxide, zirconium oxide, lanthanum oxide, yttrium oxide, tantalum oxide, gadolinium oxide, niobium oxide, titanium oxide), a dielectric silicide (e.g., aluminum silicide, hafnium silicate, zirconium silicate, lanthanum silicide, yttrium silicide, tantalum silicide), and a dielectric nitride (e.g., aluminum nitride, hafnium nitride, lanthanum nitride, yttrium nitride, tantalum nitride). In some embodiments, the barrier material 122 comprises aluminum oxide.

A thickness (e.g., in the X-direction and in the Y-direction) of the barrier material 122 may be within a range from about 2 nm to about 10 nm, such as from about 2 nm to about 4 nm, from about 4 nm to about 6 nm, from about 6 nm to about 8 nm, from about 8 nm to about 10 nm. However, the disclosure is not so limited and the thickness of the barrier material 122 may be different than that described above.

With continued reference to FIG. 1C, after forming the insulative material 132, portions of the insulative material over the stack structure 102 may be removed, such as by exposing the microelectronic device structure 100 to a chemical mechanical planarization (CMP) process. Removal of portions of the insulative material may exposed horizontally extending portions of the channel material 130.

Referring now to FIG. 1E, a portion of the insulative material 132 may be removed (e.g., recessed) to form recesses 134. The insulative material 132 may be recessed such that an upper surface of the insulative material 132 is substantially coplanar with an uppermost one of the tiers 108 of the insulative structures 104 and additional insulative structures 106 (e.g., an uppermost surface of the uppermost tier 108). In some embodiments, an upper surface of the insulative material 132 is substantially coplanar with an uppermost one of the insulative structures 104 or additional insulative structures 106.

The insulative material 132 may be recessed by, for example, exposing the insulative material 132 to a wet etchant or a dry etchant. By way of non-limiting example, the insulative material 132 may be selectively removed (e.g., relative to the other materials, such as the channel material 130) by exposing the insulative material 132 to a wet etchant, such as hydrofluoric acid (HF). In other embodiments, the insulative material 132 is selectively removed by exposing the insulative material 132 to a dry etchant including one or more of sulfur hexafluoride ($SF_6$), nitrogen trifluoride ($NF_3$), tetrafluoromethane ($CF_4$) and oxygen, trifluoromethane ($CHF_3$), hexafluoromethane ($C_2F_6$), octafluoropropane ($C_3F_8$), perfluorocyclopentene (ON, and carbon monoxide. However, the disclosure is not so limited and the insulative material 132 may be recessed by methods other than those described.

Referring now to FIG. 1F, after recessing the insulative material 132, a first conductive material 136 may be conformally formed over the microelectronic device structure 100 and within the recesses 134 (FIG. 1E). The first conductive material 136 may be formed by one or more of CVD, ALD, plasma enhanced ALD, PVD, PECVD, or LPCVD. In some embodiments, the first conductive material 136 is formed by ALD.

The first conductive material 136 may be formed of and include one or more N-type conductivity materials (e.g., polysilicon doped with at least one N-type dopant, such as one or more of arsenic, phosphorous, antimony, and bismuth). In some embodiments, the first conductive material 136 comprises N-doped polysilicon, such as polysilicon doped with phosphorus, arsenic, or both. In some embodiments, the first conductive material 136 comprises a different material composition than the material composition of the channel material 130. In some embodiments, the dopants of the first conductive material 136 are different than the dopants of the channel material 130. In some embodiments, a concentration of dopants of the first conductive material 136 is greater than a concentration of dopants of the channel material 130.

A thickness T of the first conductive material 136 may be within a range from about 20 nm to about 40 nm, such as from about 20 nm to about 30 nm, or from about 30 nm to about 40 nm. As will be described herein, the thickness T of the first conductive material 136 may be selected to control a dimension of a void (e.g., void 146 (FIG. 1H)) between conductive contact structures (e.g., conductive contact structures 144 (FIG. 1G)) and a laterally neighboring material. In some embodiments, since the pillars 120 exhibit a substantially circular cross-sectional shape, it will be understood that the first conductive material 136 may comprise an annular shape.

An opening 138 between horizontally neighboring portions of the first conductive material 136 may have a dimension (e.g., diameter) $D_2$ within a range from about 15 nm to about 25 nm, such as from about 15 nm to about 20 nm, or from about 20 nm to about 25 nm. However, the disclosure is not so limited and the dimension $D_2$ may be different than that described above.

With reference to FIG. 1G, a barrier material 140 may be formed in the openings 138 (FIG. 1F) and a second conductive material 142 may be formed over the barrier material 140. The barrier material 140 conformally overlie surfaces of the microelectronic device structure 100. The second conductive material 142 may be in electrical communication with the channel material 130 through the first conductive material 136. In some embodiments, the second conductive material 142 and the barrier material 140 form a conductive contact structure 144 (which may also be referred to herein as a "drain contact"). Portions of the barrier material 140 and the second conductive material 142 outside of the openings 138 may be removed, such as by exposing the microelectronic device structure 100 to a CMP process to expose an upper surface of the first conductive material 136.

The barrier material 140 may include one or more materials formulated and configured to reduce or prevent diffusion of materials of the second conductive material 142 to the first conductive material 136. By way of non-limiting example, the barrier material 140 may include a first material comprising titanium directly on and in contact with vertically extending (e.g., in the Z-direction) sidewalls of the first conductive material 136 and a horizontally extending (e.g., in the X-direction and in the Y-direction) portion of the first conductive material 136, and a second material comprising titanium nitride overlying the first material. In some such embodiments, the second conductive material 142 may directly overlie and contact the second material of the barrier material 140. In some embodiments, interfaces of the first conductive material 136 and the barrier material 140 comprise titanium silicide.

The second conductive material 142 may be formed of and include conductive material. In some embodiments, the second conductive material 142 comprises tungsten.

Referring now to FIG. 1H, after forming the conductive contact structure 144, portions of the first conductive material 136 and the channel material 130 may be selectively removed to form voids (e.g., spaces, gaps, air gaps, vacuum regions) 146 between the second conductive material 142 and vertically extending (e.g., in the Z-direction) sidewalls of the tunnel dielectric material 128.

The first conductive material 136 and the channel material 130 may be selectively removed by, for example, exposing the microelectronic device structure 100 to a dry etchant formulated and configured to selectively remove polysilicon, such as, for example, one or more $SF_6$, chlorine ($Cl_2$), hydrogen ($H_2$), ammonia ($NH_3$), difluoromethane ($CH_2F_2$), fluorine ($F_2$), or another material. In some embodiments, the dry etchant comprises a hydrogen-containing material (e.g., one or more of $H_2$ and $NH_3$), and at least another material (e.g., one or more of $NF_3$, $CF_4$, $SF_6$, $C_2F_6$, $CHF_3$, $CH_2F_2$, $C_3F_8$, $C_4F_8$, and $F_2$).

In some embodiments, a portion of the first conductive material 136 remains unremoved. In some such embodiments, conductive contact structure 144 extends at least partially into the first conductive material 136 a height H. Accordingly, a lower portion of the barrier material 140 and the conductive material 142 (corresponding to the height H) may form a substantially Ohmic contact with the first conductive material 136, facilitating electrical continuity between the channel material 130 and the conductive material 142 and a reduced electrical resistance between the channel material and the conductive material 142.

The height H may be within a range from about 50 nm to about 400 nm, such as from about 50 nm to about 100 nm, from about 100 nm to about 200 nm, from about 200 nm to about 300 nm, or from about 300 nm to about 400 nm. However, the disclosure is not so limited and the height H may be different than that described above.

With reference to FIG. 1I, portions of the tunnel dielectric material 128 and the memory material 126 may be selectively removed relative to the charge blocking material 124 and the second conductive material 142 to increase sizes of the voids 146. Removal of the portions of the tunnel dielectric material 128 and the memory material 126 may increase the lateral dimension (e.g., in the X-direction, in the Y-direction) of each of the voids 146 between vertically extending (e.g., in the Z-direction) sidewalls of the conductive contact structure 144 and the sidewalls of the charge blocking material 124. By way of non-limiting example, the tunnel dielectric material 128 and the memory material 126 may be exposed to a wet etchant including one or more of hydrofluoric acid, ammonium fluoride, water, acetic acid, nitric acid, phosphoric acid, or hydrochloric acid to selectively remove the tunnel dielectric material 128 and the memory material 126 relative to the charge blocking material 124.

In some embodiments, laterally extending (e.g., in the X-direction, in the Y-direction) portions of the barrier material 122 and the charge blocking material 124 may remain over the dielectric material 116. Vertically extending (e.g., in the Z-direction) portions of the barrier material 122 and the charge blocking material 124 may laterally neighbor the void 146.

In some embodiments, such as where a larger void 146 is desired, at least a portion of one or more of the charge blocking material 124, the barrier material 122, and the dielectric material 116 may be removed to expose vertically extending (e.g., in the Z-direction) of the dielectric material 116. In some such embodiments, a portion of the dielectric material 116 may remain between laterally neighboring (e.g., in the X-direction, in the Y-direction) conductive contact structures 144. In some such embodiments, a lateral dimension (e.g., in the X-direction, in the Y-direction) of the void 146 may be larger than a corresponding lateral dimension of the dielectric material 116 between laterally neighboring voids 146.

Referring now to FIG. 1J, an additional dielectric material 148 may be formed (e.g., non-conformally formed) over the microelectronic device structure 100. In some such embodiments, a vertically upper (e.g., in the Z-direction) surface of the additional dielectric material 148 vertically overlying (e.g., in the Z-direction) the voids 146 and the conductive contact structures 144 is vertically (e.g., in the Z-direction) higher than upper surfaces of the additional dielectric material 148 vertically overlying the charge blocking material 124 and the dielectric material 116.

The additional dielectric material 148 may be formed by one or more of CVD, ALD, plasma enhanced ALD, PVD, PECVD, or LPCVD. In some embodiments, the additional dielectric material 148 is formed by a non-conformal CVD process.

The additional dielectric material 148 may be formed of and include one or more of the materials described above with reference to the dielectric material 116. In some embodiments, the additional dielectric material 148 comprises substantially the same material composition as the dielectric material 116. In some embodiments, the additional dielectric material 148 comprises silicon dioxide.

The voids 146 may individually comprise a region (e.g., a region substantially free of each of solids, liquids, gases, and other states of matter), air (e.g., a mixture of nitrogen and oxygen), or one or more process gases (e.g., precursor gases), such as gases used to form the additional dielectric material 148. In some embodiments, the voids 146 comprise a vacuum. In yet other embodiments, the voids 146 comprise one or more of tetraethylorthosilicate (TEOS) ($Si(OC_2H_5)_4$), silane ($SiH_4$), (3-mercaptopropyl) trimethoxysilane, (3-aminopropyl)trimethoxysilane, an aminosilane (e.g., tris(dimethylamino) silane (3DMAS), bis(diethylamino) silane (BDEAS), bis(t-butylamino) silane, di-sec-butylaminosilane (DSBAS)), or another material. In some embodiments, the void 146 comprises a gas and is substantially free of a liquid or a solid.

A dielectric constant of the voids 146 may be less than a dielectric constant of silicon dioxide. In some embodiments, the dielectric constant of the voids 146 is less than about 3.9. The dielectric constant of the voids 146 may be within a range from about 1.0 to about 3.8, such as from about 1.0 to about 1.2, from about 1.2 to about 1.5, from about 1.5 to about 2.0, from about 2.0 to about 2.5, from about 2.5 to about 3.0, or from about 3.0 to about 3.8. In some embodiments, the dielectric constant of the void 146 is about 1.0.

With combined reference to FIG. 1K and FIG. 1L, after forming the additional dielectric material 148, slot structures 150 may be formed through the stack structure 102 to facilitate replacement of the additional insulative structures 106 with conductive structures 154 through so-called "replacement gate" or "gate last" processing acts. FIG. 1K is a simplified cross-sectional view of the microelectronic device structure 100 taken through section line K-K of FIG. 1L, which is a top view of the microelectronic device structure 100.

Slots (also referred to herein as "replacement gate slots") may be formed through the stack structure 102 at locations corresponding to the slot structures 150 to extend through the additional dielectric material 148, the laterally extending (e.g., in the X-direction, in the Y-direction) portions of the charge blocking material 124 and the barrier material 122, the dielectric material 116, and the tiers 108 of the insulative structures 104 and the additional insulative structures 106 (FIG. 1J). In some embodiments, the slots may expose the source tier 110, such as the first source material 112.

The additional insulative structures 106 (FIG. 1J) may be selectively removed (e.g., exhumed) through the slots and spaces between vertically neighboring (e.g., in the Z-direction) insulative structures 104 may be filled with a conductive material to form the conductive structures 154 and a stack structure 156 including tiers 158 of the insulative structures 104 and the conductive structures 154. The conductive structures 154 may be located at locations corresponding to the locations of the additional insulative structures 106 removed through the slots.

After forming the conductive structures 154, the slots may be filled with one or more materials to form the slot structures 150. In some embodiments, the slot structures 150 include an insulative material 152. The insulative material 152 may include one or more of the materials described above with reference to the insulative structures 104. In some embodiments, the insulative material 152 comprises silicon dioxide. In other embodiments, the slot structures 150 include, for example, a liner material on sidewalls thereof and a conductive material horizontally neighboring the liner material. In some such embodiments, the liner material may comprise an insulative material, such as, for example, silicon dioxide; and the conductive material may include polysilicon or tungsten and may be in electrical communication with the source tier 110 (e.g., such as through the first source material 112).

The conductive structures 154 may be formed of and include at least one conductive material, such as at least one metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), at least one alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), at least one conductively-doped semiconductor material (e.g., conductively-doped polysilicon, conductively-doped germanium (Ge), conductively-doped silicon germanium (SiGe)), at least one conductive metal-containing material (e.g., a conductive metal nitride, a conductive metal silicide, a conductive metal carbide, a conductive metal oxide), or combinations thereof. In some embodiments, the conductive structures 154 are formed of and include tungsten.

Each of the conductive structures 154 may individually include a substantially homogeneous distribution of the at least one conductive material, or a substantially heterogeneous distribution of the at least one conductive material. In some embodiments, each of the conductive structures 154 of each of the tiers 158 of the stack structure 156 exhibits a substantially homogeneous distribution of conductive material. In additional embodiments, at least one of the conductive structures 154 of at least one of the tiers 158 of the stack structure 156 exhibits a substantially heterogeneous distribution of at least one conductive material. The conductive structure 154 may, for example, be formed of and include a stack of at least two different conductive materials. The conductive structures 154 of each of the tiers 158 of the stack structure 156 may each be substantially planar, and may each exhibit a desired thickness.

In some embodiments, the conductive structures 154 may include a conductive liner material around the conductive structures 154, such as between the conductive structures 154 and the insulative structures 104. The conductive liner material may comprise, for example, a seed material from which the conductive structures 154 may be formed. The conductive liner material may be formed of and include, for example, a metal (e.g., titanium, tantalum), a metal nitride (e.g., tungsten nitride, titanium nitride, tantalum nitride), or another material. In some embodiments, the conductive liner material comprises titanium nitride.

At least one lower conductive structure 154 of the stack structure 156 may be employed as at least one lower select gate (e.g., at least one source side select gate (SGS)) of the microelectronic device structure 100. In some embodiments, a single (e.g., only one) conductive structure 154 of a vertically lowermost tier 158 of the stack structure 156 is employed as a lower select gate (e.g., a SGS) of the microelectronic device structure 100. In addition, upper conductive structure(s) 154 of the stack structure 156 may be employed as upper select gate(s) (e.g., drain side select gate(s) (SGDs)) of the microelectronic device structure 100. In some embodiments, horizontally-neighboring conductive structures 154 of a vertically uppermost tier 158 of the stack structure 156 (e.g., separated from each other by additional slot structures) are employed as upper select gates (e.g., SGDs) of the microelectronic device structure 100. In some embodiments, more than one (e.g., two, four, five, six) conductive structures 154 are employed as an upper select gate (e.g., a SGD) of the microelectronic device structure.

With continued reference to FIG. 1K, formation of the conductive structures 154 may form strings 155 of memory cells 157, each memory cell 157 located at an intersection of a conductive structure 154 and the memory cell materials (e.g., the barrier material 122, the charge blocking material 124, the memory material 126, and the tunnel dielectric material 128) and the channel material 130. In FIG. 1L, the strings 155 are illustrated in broken lines to indicate that the strings are located underneath the additional dielectric material 148.

At least a portion of each void 146 may be located within lateral boundaries (e.g., in the X-direction, in the Y-direction) of the strings 155 of memory cells 157. By way of non-limiting example, at least a portion of each void 146 may be located within lateral boundaries defined by, for example, the channel material 130. In some embodiments, substantially all of the void 146 may be located within lateral boundaries of the strings 155 of memory cells 157.

Referring now to FIG. 1M, after forming the conductive structures 154, the microelectronic device structure 100 may be exposed to a CMP process to remove vertically upper (e.g., in the Z-direction) portions of the additional insulative material 148 and form a substantially planar upper surface of the additional insulative material 148. In some embodiments, the CMP process may be configured to stop on the conductive contact structure 144. Exposing the microelectronic device structure 100 to the CMP process may expose an upper surface of the conductive contact structure 144.

In some embodiments, after exposing an upper surface of the conductive contact structure 144, surfaces of the additional insulative material 148 may be recessed relative to an upper surface of the conductive contact structure 144. By way of non-limiting example, the microelectronic device structure 100 may be exposed to a dry etchant formulated and configured to selectively remove the additional insulative material 148 relative to the conductive contact structure 144. For example, the additional insulative material 148 may be selectively removed by exposing the additional insulative material 148 to a reactive ion etch (RIE) process including one or more of trifluoromethane, argon, oxygen. In other embodiments, the additional insulative material 148 may be selectively removed by exposure to one or more wet etchants, such as one or more of hydrofluoric acid, nitric acid, and ammonia.

With reference to FIG. 1N, a dielectric material 160 may be conformally formed over the microelectronic device structure 100 and an etch stop material 162 may be conformally formed over the dielectric material 160. After forming the etch stop material 162, the microelectronic device structure 100 may be exposed to a CMP process to expose an upper surface of the dielectric material 160, such as a portion of the dielectric material 160 vertically overlying (e.g., in the Z-direction) the conductive contact structures 144 to expose a portion of the etch stop material 162.

The dielectric material 160 may be formed of and include insulative material, such as one or more of the materials described above with reference to the dielectric material 116. In some embodiments, the dielectric material 160 comprises an oxide material, such as silicon dioxide. The etch stop material 162 may comprise a material exhibiting an etch selectivity with respect to the dielectric material 160. By way of non-limiting example, the etch stop material 162 may be formed of and include one or more of the materials described above with reference to the additional insulative structures 106. In some embodiments, the etch stop material 162 comprises a nitride material, such as silicon nitride.

The dielectric material 160 and the etch stop material 162 may individually be formed by one or more of CVD, ALD, plasma enhanced ALD, PVD, PECVD, or LPCVD. In some embodiments, the dielectric material 160 and the etch stop material 162 are individually formed by CVD.

Referring now to FIG. 1O, portions of the dielectric material 160 overlying the conductive contact structures 144 may be selectively removed to form openings overlying the conductive contact structures 144 and expose an uppermost surface of the conductive contact structures 144. In some embodiments, the dielectric material 160 is selectively removed by exposing the dielectric material 160 to a dry etchant including one or more of carbon tetrafluoride, oxygen, hydrogen, ammonia, and nitrogen trifluoride.

After exposing the uppermost surface of the conductive contact structures 144, a conductive material 164 may be formed within the openings and in electrical communication with the conductive contact structures 144. The conductive material 164 may be formed by, for example, sputtering. However, the disclosure is not so limited and the conductive material 164 may be formed by other methods.

The conductive material 164 may be formed of and include one or more conductive materials. In some embodiments, the conductive material 164 comprises substantially the same material composition as the conductive material 142. In some embodiments, the conductive material 164 comprises tungsten.

With continued reference to FIG. 1O, after forming the conductive material 164, the microelectronic device structure 100 may be exposed to a CMP process to remove portions of the conductive material 164 from surfaces of the etch stop material 162 and form conductive landing pad structures 166 comprising the conductive material 164.

Referring now to FIG. 1P, a conductive contact 170 may be formed in electrical communication with the conductive landing pad structures 166. For example, an additional etch stop material 168 may be formed over the etch stop material 162. Openings may be formed through the additional etch stop material 168 to expose at least a portion of the conductive landing pad structures 166 and the conductive contacts 170 may be formed within the openings and in electrical communication with the conductive material 164 of the conductive landing pad structures 166.

After forming the conductive contacts 170, conductive lines (e.g., access lines, such as bit lines) may be formed in electrical communication with the conductive contacts 170 and may be in electrical communication with the channel material of the strings 155 of memory cells 157 through the conductive contact structures 144. In some embodiments, the conductive lines extend in a direction substantially perpendicular to the direction of the slot structures 150 (FIG. 1K, FIG. 1L).

Although the microelectronic device structure 100 has been described and illustrated as including the conductive landing pad structures 166, the disclosure is not so limited. In other embodiments, the conductive contact structure 144 is in electrical communication with a conductive line through one or more conductive contact structures (e.g., a conductive plug structure).

Although the microelectronic device structure 100 has been described and illustrated as comprising memory cells 157 having a particular configuration, the disclosure is not so limited. In some embodiments, the memory cells 157 may comprise so-called "MONOS" (metal-oxide-nitride-oxide-semiconductor) memory cells. In additional embodiments, the memory cells 157 comprise so-called "TANOS" (tantalum nitride-aluminum oxide-nitride-oxide-semiconductor) memory cells, or so-called "BETANOS" (band/barrier engineered TANOS) memory cells, each of which are subsets of MONOS memory cells. In other embodiments, the memory cells 157 comprise so-called "floating gate" memory cells including floating gates (e.g., metallic floating gates) as charge storage structures. The floating gates may horizontally intervene between central structures of the strings 155 and the conductive structures 154.

Forming the conductive contact structures 144 to include the voids 146 horizontally neighboring (e.g., in the X-direction, in the Y-direction) the conductive material 142 may facilitate formation of conductive contact structures 144 and conductive lines exhibiting a reduced capacitance (e.g., capacitive coupling) compared to the capacitance conductive contact structures and conductive lines of conventional microelectronic devices not including the voids 146. For example, since the voids 146 may exhibit a reduced capacitance compared to conventional dielectric materials (e.g., silicon dioxide), the capacitance contribution of the conductive material 142 may be reduced (since the capacitance between horizontally neighboring conductive materials 142 is proportional to the dielectric constant of the insulative materials (e.g., the material within the voids 146 and the dielectric material 116) between the horizontally neighboring conductive materials 142).

Although FIG. 1A through FIG. 1P have been described and illustrated as forming the uppermost conductive structures 154 to comprise the upper select gate(s) (e.g., drain side select gate(s) (SGDs)) of the microelectronic device structure 100, the disclosure is not so limited. In other embodiments, the uppermost conductive structures 154 comprising the upper select gate(s) may be formed separately from the other conductive structures 154 in a so-called "de-integrated select gate formation" process. In some such embodiments, openings may be formed through a first stack structure including alternating tiers of insulative structures 104 and the additional insulative structures 106, as described above with reference to FIG. 1A and FIG. 1B. Pillars comprising the barrier material 122, the charge blocking material 124, the memory material 126, the tunnel dielectric material 128, the channel material 130, and the insulative material 132 may be formed in the openings, as described above with reference to FIG. 1C and FIG. 1D.

In some embodiments, a conductive material (or a sacrificial material) is formed within upper portions of the pillars and in electrical communication with the channel material of each pillar. Additional tiers of insulative structures and additional insulative structures are formed over the first stack structure to form a second stack structure vertically overlying the first stack structure. Openings are formed through the second stack structure to expose the conductive material of the pillars of the first stack structure. In some embodiments, the openings of the second stack structure are at least partially laterally offset (e.g., in the X-direction, in the Y-direction) from the pillars of the first stack structure. At least a portion of the conductive material may be removed through the openings and an additional channel material may be formed within the openings of the second stack structure and in electrical communication with the channel material of the pillars. Remaining portions of the openings may be filled with an insulative material. Thereafter, slots may be formed through the second stack structure and the first stack structure and the additional insulative structures of the first stack structure and the second stack structure may be removed and replaced with conductive structures, as described above with reference to FIG. 1K. The conductive structures of the second stack structure may comprise upper select gate(s) (e.g., drain side select gate(s) (SGDs)) of the microelectronic device structure. Fabrication of the microelectronic device structure may be completed as described above with reference to FIG. 1M through FIG. 1P.

Figure 2:
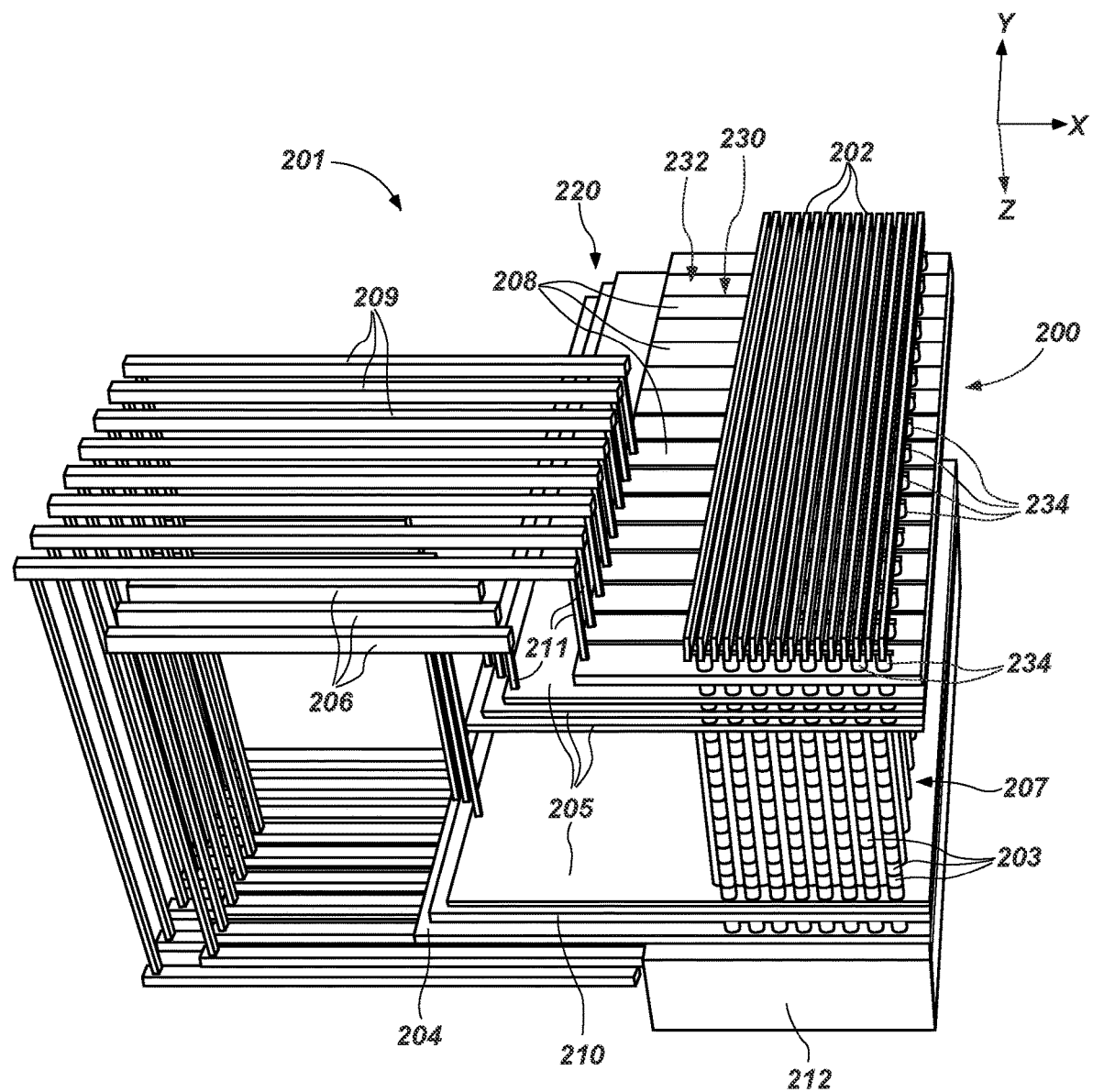
FIG. 2 is a partial cutaway perspective view of a microelectronic device, in accordance with embodiments of the disclosure.

FIG. 2 illustrates a partial cutaway perspective view of a portion of a microelectronic device 201 (e.g., a memory device, such as a dual deck 3D NAND Flash memory device) including a microelectronic device structure 200. The microelectronic device structure 200 may be substantially similar to the microelectronic device structure 100 following the processing stages previously described with reference to FIG. 1P. As shown in FIG. 2, the microelectronic device structure 200 may include a staircase structure 220 defining contact regions for connecting access lines 206 to conductive tiers 205 (e.g., conductive layers, conductive plates, such as the conductive structures 154 (FIG. 1P)). The microelectronic device structure 200 may include vertical strings 207 (e.g., strings 155 (FIG. 1P)) of memory cells 203 (e.g., memory cells 157 (FIG. 1P)) that are coupled to each other in series. The vertical strings 207 may extend vertically (e.g., in the Z-direction) and orthogonally to conductive lines and tiers 205, such as data lines 202 (e.g., bit lines), a source tier 204 (e.g., the source tier 110 (FIG. 1P)), the conductive tiers 205, the access lines 206, first select gates 208 (e.g., upper select gates, drain select gates (SGDs), such as upper ones of the conductive structures 154), select lines 209, and a second select gate 210 (e.g., a lower select gate, a source select gate (SGS), such as lower ones of the conductive structures 154). The first select gates 208 may be horizontally divided (e.g., in the Y-direction) into multiple block structures 232 and sub-blocks horizontally separated (e.g., in the Y-direction) from one another by slot structures 230 (e.g., slot structures 150 (FIG. 1K, FIG. 1L)).

The data lines 202 may be electrically coupled to the vertical strings 207 through conductive contact structures 234 (e.g., conductive contact structures 144 (FIG. 1P)).

Vertical conductive contacts 211 may electrically couple components to each other as shown. For example, the select lines 209 may be electrically coupled to the first select gates 208 and the access lines 206 may be electrically coupled to the conductive tiers 205. The microelectronic device 201 may also include a control unit 212 positioned under the memory array, which may include control logic devices configured to control various operations of other features (e.g., the vertical strings 207 of memory cells 203) of the microelectronic device 201. By way of non-limiting example, the control unit 212 may include one or more (e.g., each) of charge pumps (e.g., $V_{CCP}$ charge pumps, $V_{NEGWL}$ charge pumps, DVC2 charge pumps), delay-locked loop (DLL) circuitry (e.g., ring oscillators), $V_{dd}$ regulators, drivers (e.g., string drivers), decoders (e.g., local deck decoders, column decoders, row decoders), sense amplifiers (e.g., equalization (EQ) amplifiers, isolation (ISO) amplifiers, NMOS sense amplifiers (NSAs), PMOS sense amplifiers (PSAs)), repair circuitry (e.g., column repair circuitry, row repair circuitry), I/O devices (e.g., local I/O devices), memory test devices, MUX, error checking and correction (ECC) devices, self-refresh/wear leveling devices, and other chip/deck control circuitry. The control unit 212 may be electrically coupled to the data lines 202, the source tier 204, the access lines 206, the first select gates 208, and the second select gates 210, for example. In some embodiments, the control unit 212 includes CMOS (complementary metal-oxide-semiconductor) circuitry. In such embodiments, the control unit 212 may be characterized as having a "CMOS under Array" ("CuA") configuration.

The first select gates 208 may extend horizontally in a first direction (e.g., the X-direction) and may be coupled to respective first groups of vertical strings 207 of memory cells 203 at a first end (e.g., an upper end) of the vertical strings 207. The second select gate 210 may be formed in a substantially planar configuration and may be coupled to the vertical strings 207 at a second, opposite end (e.g., a lower end) of the vertical strings 207 of memory cells 203.

The data lines 202 (e.g., bit lines) may extend horizontally in a second direction (e.g., in the Y-direction) that is at an angle (e.g., perpendicular) to the first direction in which the first select gates 208 extend. The data lines 202 may be coupled to respective second groups of the vertical strings 207 at the first end (e.g., the upper end) of the vertical strings 207. A first group of vertical strings 207 coupled to a respective first select gate 208 may share a particular vertical string 207 with a second group of vertical strings 207 coupled to a respective data line 202. Thus, a particular vertical string 207 may be selected at an intersection of a particular first select gate 208 and a particular data line 202. Accordingly, the first select gates 208 may be used for selecting memory cells 203 of the vertical strings 207 of memory cells 203.

The conductive tiers 205 may extend in respective horizontal planes. The conductive tiers 205 may be stacked vertically, such that each conductive tier 205 is coupled to all of the vertical strings 207 of memory cells 203, and the vertical strings 207 of the memory cells 203 extend vertically through the stack of conductive tiers 205. The conductive tiers 205 may be coupled to or may form control gates of the memory cells 203 to which the conductive tiers 205 are coupled. Each conductive tier 205 may be coupled to one memory cell 203 of a particular vertical string 207 of memory cells 203.

The first select gates 208 and the second select gates 210 may operate to select a particular vertical string 207 of the memory cells 203 between a particular data line 202 and the source tier 204. Thus, a particular memory cell 203 may be selected and electrically coupled to a data line 202 by operation of (e.g., by selecting) the appropriate first select gate 208, second select gate 210, and conductive tier 205 that are coupled to the particular memory cell 203.

The staircase structure 220 may be configured to provide electrical connection between the access lines 206 and the conductive tiers 205 through the vertical conductive contacts 211. In other words, a particular level of the conductive tiers 205 may be selected via an access line 206 in electrical communication with a respective vertical conductive contact 211 in electrical communication with the particular conductive tier 205.

As described above, with reference to the microelectronic device structure 100, the voids 146 (FIG. 1P) laterally neighboring the conductive contact structures 234 (e.g., the conductive contact structures 144 (FIG. 1P)) may reduce capacitive coupling between laterally neighboring conductive contact structures 234 and between conductive contact structures 234 and the data lines 202.

Thus, in accordance with some embodiments of the disclosure, a microelectronic device comprises a stack structure comprising a vertically alternating sequence of conductive structures and insulative structures arranged in tiers, strings of memory cells vertically extending through the stack structure, the strings of memory cells individually comprising a channel material vertically extending through the stack structure, a conductive contact structure vertically overlying and in electrical communication with the channel material of a string of memory cells of the strings of memory cells, and a void laterally neighboring the conductive contact structure, the conductive contact structure separated from a laterally neighboring conductive contact structure by the void, a dielectric material, and an additional void laterally neighboring the laterally neighboring conductive contact structure.

Furthermore, in accordance with additional embodiments of the disclosure, a method of forming a microelectronic device comprises forming a dielectric material vertically overlying a stack structure comprising a vertically alternating sequence of insulative structures and additional insulative structures arranged in tiers, forming pillars comprising an insulative material, a channel material, and one or more memory cell materials vertically extending through the dielectric material and the stack structure, recessing the insulative material at least to an uppermost tier of the insulative structures and additional insulative structures, forming a first conductive material in electrical communication with the channel material, forming a second conductive material in electrical communication with the first conductive material, selectively removing portions of the first conductive material and the channel material to form a void laterally neighboring the second conductive material, and forming a conductive landing pad in electrical communication with the second conductive material.

Moreover, in accordance with further embodiments of the disclosure, a memory device comprises a stack structure comprising alternating conductive structures and insulative structures arranged in tiers, a dielectric material vertically overlying the stack structure, strings of memory cells extending through the stack structure, each of the strings of memory cells comprising a channel material and one or more memory cell materials, a first conductive contact in electrical communication with the channel material of a first of the strings of memory cells, a second conductive contact in electrical communication with the channel material of a second of the strings of memory cells, a first void laterally surrounding the first conductive contact, and a second void laterally surrounding the second conductive contact.

In accordance with additional embodiments, a method of forming a memory device comprises forming openings through a dielectric material and a stack structure comprising a vertically alternating sequence of insulative structures and additional insulative structures, forming one or more memory cell materials and a channel material on vertical sidewalls of the stack structure and the dielectric material exposed by the openings, forming a polysilicon material in electrical communication with the channel material in an upper portion of the openings, forming a conductive material on the polysilicon material, removing a portion of the polysilicon material to form a void around the conductive material, and forming a conductive line vertically over the conductive material.

Figure 3:
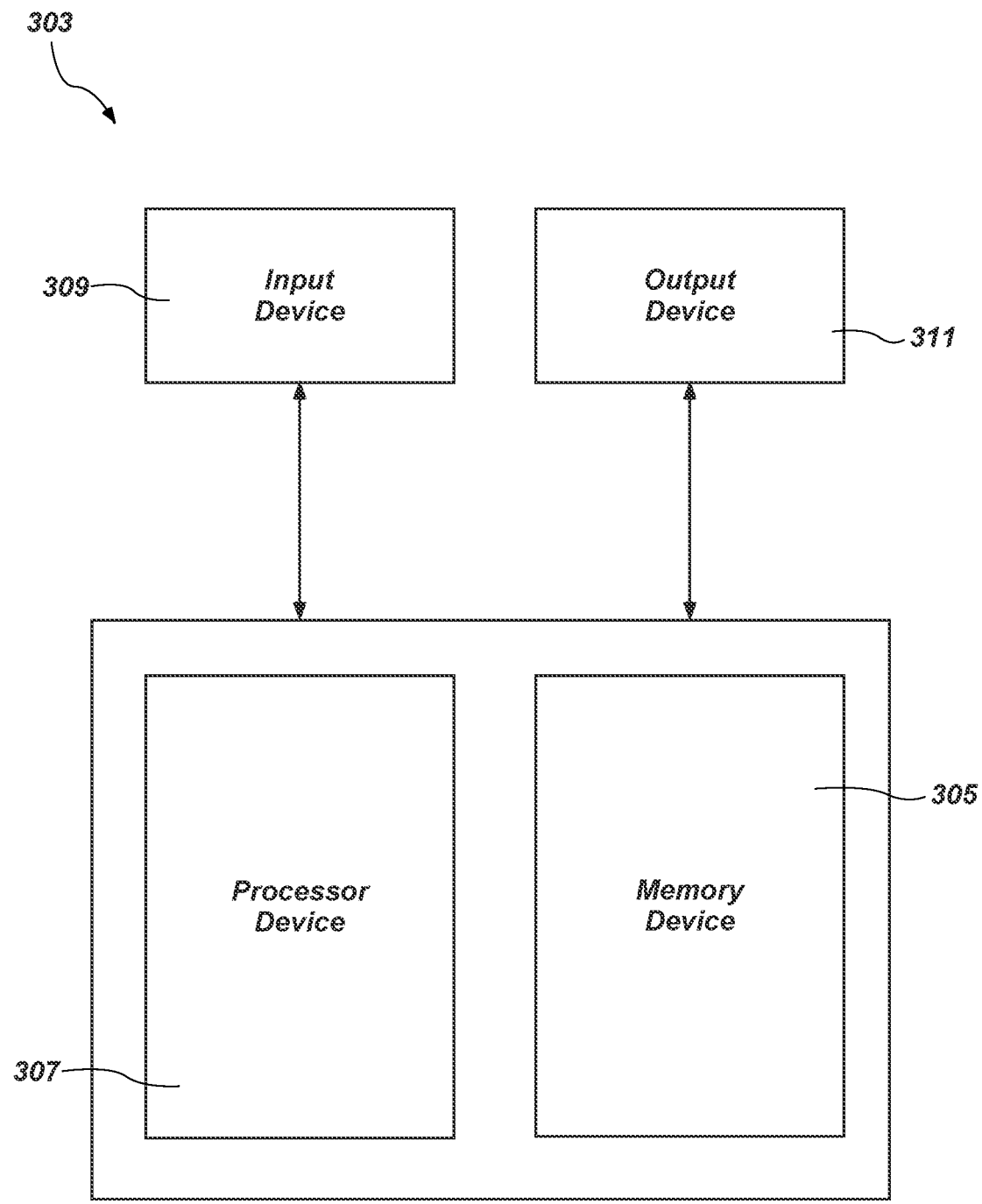
FIG. 3 is a block diagram of an electronic system, in accordance with embodiments of the disclosure.

Microelectronic devices (e.g., the microelectronic device 201 (FIG. 2)) and microelectronic device structures (e.g., the microelectronic device structures 100, 200) of the disclosure may be included in embodiments of electronic systems of the disclosure. For example, FIG. 3 is a block diagram of an electronic system 303, in accordance with embodiments of the disclosure. The electronic system 303 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an IPAD® or SURFACE® tablet, an electronic book, a navigation device, etc. The electronic system 303 includes at least one memory device 305. The memory device 305 may include, for example, an embodiment one or more of a microelectronic device structure herein (e.g., the microelectronic device structure 100, 200) and a microelectronic device (e.g., the microelectronic device 201) previously described herein.

The electronic system 303 may further include at least one electronic signal processor device 307 (often referred to as a "microprocessor"). The electronic signal processor device 307 may, optionally, include an embodiment of one or more of a microelectronic device and a microelectronic device structure previously described herein. The electronic system 303 may further include one or more input devices 309 for inputting information into the electronic system 303 by a user, such as, for example, a mouse or other pointing device, a keyboard, a touchpad, a button, or a control panel. The electronic system 303 may further include one or more output devices 311 for outputting information (e.g., visual or audio output) to a user such as, for example, a monitor, a display, a printer, an audio output jack, a speaker, etc. In some embodiments, the input device 309 and the output device 311 may comprise a single touchscreen device that can be used both to input information to the electronic system 303 and to output visual information to a user. The input device 309 and the output device 311 may communicate electrically with one or more of the memory device 305 and the electronic signal processor device 307.

Figure 4:
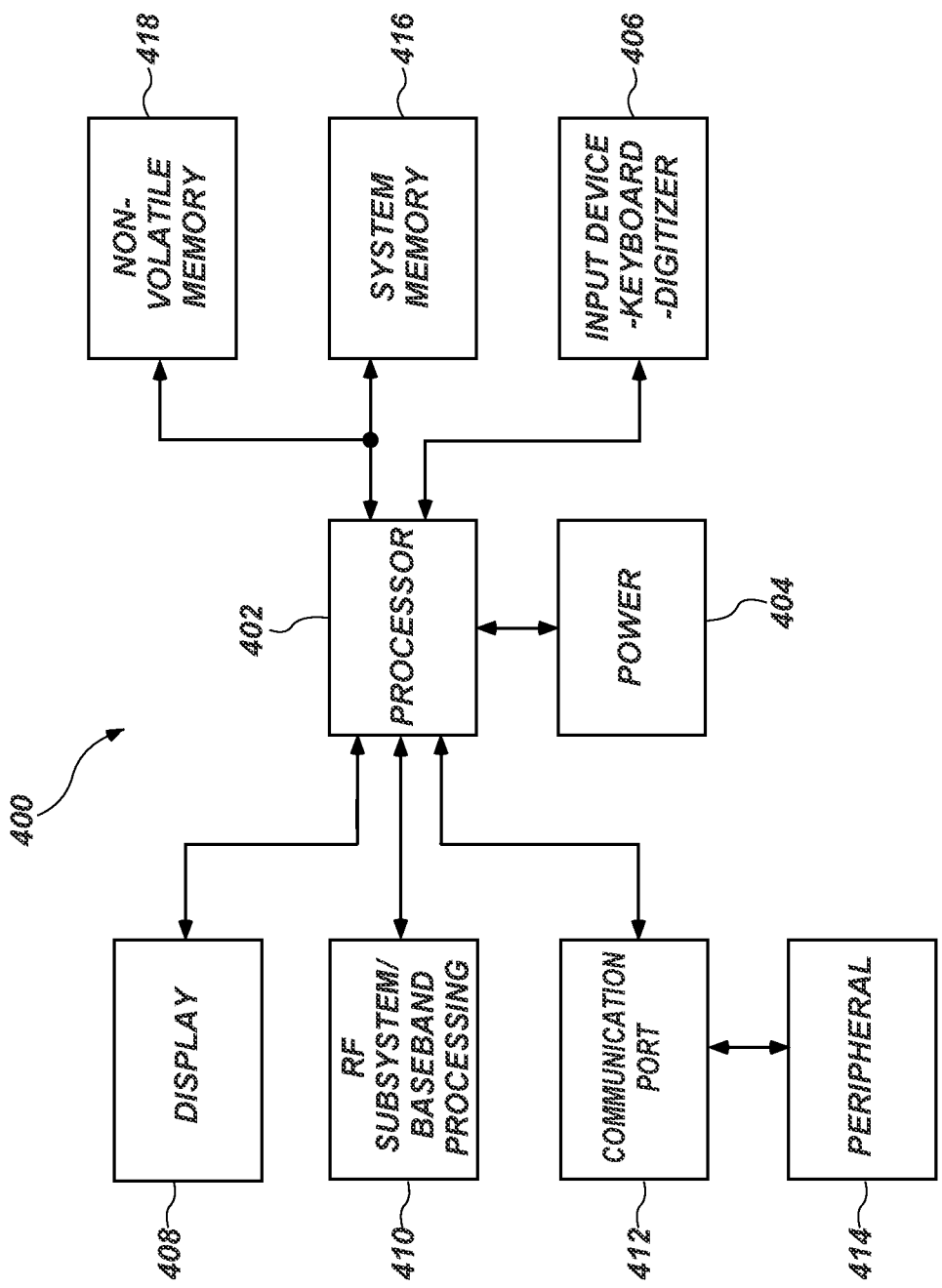
FIG. 4 is a block diagram of a processor-based system, in accordance with embodiments of the disclosure.

With reference to FIG. 4, depicted is a processor-based system 400. The processor-based system 400 may include one or more of a microelectronic device and a microelectronic device structure previously described herein and manufactured in accordance with embodiments of the disclosure. The processor-based system 400 may be any of a variety of types such as a computer, pager, cellular phone, personal organizer, control circuit, or other electronic device. The processor-based system 400 may include one or more processors 402, such as a microprocessor, to control the processing of system functions and requests in the processor-based system 400. The processor 402 and other subcomponents of the processor-based system 400 may include one or more of a microelectronic device and a microelectronic device structure previously described herein and manufactured in accordance with embodiments of the present disclosure.

The processor-based system 400 may include a power supply 404 in operable communication with the processor 402. For example, if the processor-based system 400 is a portable system, the power supply 404 may include one or more of a fuel cell, a power scavenging device, permanent batteries, replaceable batteries, and rechargeable batteries. The power supply 404 may also include an AC adapter; therefore, the processor-based system 400 may be plugged into a wall outlet, for example. The power supply 404 may also include a DC adapter such that the processor-based system 400 may be plugged into a vehicle cigarette lighter or a vehicle power port, for example.

Various other devices may be coupled to the processor 402 depending on the functions that the processor-based system 400 performs. For example, a user interface 406 may be coupled to the processor 402. The user interface 406 may include input devices such as buttons, switches, a keyboard, a light pen, a mouse, a digitizer and stylus, a touch screen, a voice recognition system, a microphone, or a combination thereof. A display 408 may also be coupled to the processor 402. The display 408 may include an LCD display, an SED display, a CRT display, a DLP display, a plasma display, an OLED display, an LED display, a three-dimensional projection, an audio display, or a combination thereof. Furthermore, an RF sub-system/baseband processor 410 may also be coupled to the processor 402. The RF sub-system/baseband processor 410 may include an antenna that is coupled to an RF receiver and to an RF transmitter (not shown). A communication port 412, or more than one communication port 412, may also be coupled to the processor 402. The communication port 412 may be adapted to be coupled to one or more peripheral devices 414, such as a modem, a printer, a computer, a scanner, or a camera, or to a network, such as a local area network, remote area network, intranet, or the Internet, for example.

The processor 402 may control the processor-based system 400 by implementing software programs stored in the memory. The software programs may include an operating system, database software, drafting software, word processing software, media editing software, or media playing software, for example. The memory is operably coupled to the processor 402 to store and facilitate execution of various programs. For example, the processor 402 may be coupled to system memory 416, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 416 may include volatile memory, non-volatile memory, or a combination thereof. The system memory 416 is typically large so that it can store dynamically loaded applications and data. In some embodiments, the system memory 416 may include semiconductor devices, such as one or more of a microelectronic devices and a microelectronic device structure previously described herein.

The processor 402 may also be coupled to non-volatile memory 418, which is not to suggest that system memory 416 is necessarily volatile. The non-volatile memory 418 may include one or more of STT-MRAM, MRAM, read-only memory (ROM) such as an EPROM, resistive read-only memory (RROM), and flash memory to be used in conjunction with the system memory 416. The size of the non-volatile memory 418 is typically selected to be just large enough to store any necessary operating system, application programs, and fixed data. Additionally, the non-volatile memory 418 may include a high-capacity memory such as disk drive memory, such as a hybrid-drive including resistive memory or other types of non-volatile solid-state memory, for example. The non-volatile memory 418 may include microelectronic devices, such as one or more of a microelectronic device and a microelectronic device structure previously described herein.

Accordingly, in at least some embodiments, an electronic device comprises an input device, an output device, a processor device operably coupled to the input device and the output device, and a memory device operably coupled to the processor device and comprising at least one microelectronic device structure. The at least one microelectronic device structure comprises strings of memory cells vertically extending through a vertically alternating sequence of insulative structures and conductive structures, a conductive material in electrical communication with a channel material of one of the strings of memory cells, and a void laterally neighboring the conductive material and within lateral boundaries defined by the one of the strings of memory cells.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
   a stack structure comprising a vertically alternating sequence of conductive structures and insulative structures arranged in tiers;
   strings of memory cells vertically extending through the stack structure, the strings of memory cells individually comprising a channel material vertically extending through the stack structure;
   a conductive contact structure vertically overlying and in electrical communication with the channel material of a string of memory cells of the strings of memory cells;
   a void laterally neighboring the conductive contact structure and directly vertically above and contacting, laterally overlapping, and partially defined by an upper surface of the channel material of the string of memory cells, the conductive contact structure separated from a laterally neighboring conductive contact structure by the void, a dielectric material, and an additional void laterally neighboring the laterally neighboring conductive contact structure;
   wherein the void comprises an annular cross-sectional shape; and
   wherein a dielectric constant of the void is within a range from about 1.0 to about 1.5.

2. The microelectronic device of claim 1, further comprising N-doped polysilicon electrically connecting the channel material to the conductive contact structure, the void directly vertically above and contacting, laterally overlapping, and partially defined by an upper surface of the N-doped polysilicon, and the conductive contact structure vertically extending at least partially into the N-doped polysilicon.

3. The microelectronic device of claim 1, further comprising a conductive landing pad vertically overlying the conductive contact structure, the void vertically below and laterally overlapping the conductive landing pad.

4. The microelectronic device of claim 1, wherein the void laterally extends from the conductive contact structure to a tunnel dielectric material laterally surrounding the channel material of the string of memory cells.

5. The microelectronic device of claim 1, wherein the void is substantially within lateral boundaries of the string of memory cells.

6. The microelectronic device of claim 1, wherein the conductive contact structure vertically extends above an upper surface of the dielectric material.

7. The microelectronic device of claim 1, wherein the void comprises a gas or a vacuum.

8. A memory device, comprising:
   a stack structure comprising alternating conductive structures and insulative structures arranged in tiers;
   a dielectric material vertically overlying the stack structure;
   strings of memory cells extending through the stack structure, each of the strings of memory cells comprising a channel material and one or more memory cell materials;
   a first conductive contact in electrical communication with the channel material of a first of the strings of memory cells;
   a second conductive contact in electrical communication with the channel material of a second of the strings of memory cells;
   a first void laterally surrounding the first conductive contact, the first void directly vertically above and contacting, laterally overlapping, and partially defined by an upper surface of the channel material of the first of the strings of memory cells;
   a second void laterally surrounding the second conductive contact, the second void directly vertically above and contacting, laterally overlapping, and partially defined by an upper surface of the channel material of the second of the strings of memory cells;
   wherein the first and second void comprises an annular cross-sectional shape; and wherein a dielectric constant of the first and second void is within a range from about 1.0 to about 1.5.

9. The memory device of claim 8, wherein a dielectric constant of the first void and the second void is less than a dielectric constant of silicon dioxide.

10. The memory device of claim 8, further comprising a conductive material in electrical communication with the channel material and the first conductive contact, the conductive material comprising a higher concentration of dopants than the channel material.

11. The memory device of claim 8, wherein the one or more memory cell materials is laterally between the first conductive contact and the second conductive contact.

12. The memory device of claim 8, further comprising a bit line vertically overlying and in electrical communication with the first conductive contact.

13. The memory device of claim 8, wherein the first conductive contact comprises tungsten.

14. The memory device of claim 8, wherein the dielectric material, the first void, and the second void are laterally between the first conductive contact and the second conductive contact.

* * * * *

UNITED STATES PATENT AND TRADEMARK OFFICE
CERTIFICATE OF CORRECTION

| | | |
|---|---|---|
| PATENT NO. | : 12,040,223 B2 | |
| APPLICATION NO. | : 17/141722 | |
| DATED | : July 16, 2024 | |
| INVENTOR(S) | : Darwin A. Clampitt, John D. Hopkins and Madison D. Drake | |

Page 1 of 1

It is certified that error appears in the above-identified patent and that said Letters Patent is hereby corrected as shown below:

In the Specification

Column 1, Line 67, change "FIG.1C, FIG. 1E through" to --FIG. 1C, FIG. 1E through--

Column 2, Line 2, change "(FIG. 1B, FIG. 1D, and" to --(FIG. 1B, FIG. 1D, and--

Column 11, Line 6, change "perfluorocyclopentene (ON, and" to --perfluorocyclopentene ($C_5F_8$), and--

In the Claims

Claim 1, Column 24, Line 3, change "of memory cells;" to --of memory cells; and--

Claim 8, Column 24, Line 60, change "of memory cells;" to --of memory cells; and--

Signed and Sealed this
Twenty-fourth Day of September, 2024

Katherine Kelly Vidal
*Director of the United States Patent and Trademark Office*